US010230007B2

(12) United States Patent
Sasaki et al.

(10) Patent No.: US 10,230,007 B2
(45) Date of Patent: Mar. 12, 2019

(54) SEMICONDUCTOR ELEMENT, METHOD FOR MANUFACTURING SAME, SEMICONDUCTOR SUBSTRATE, AND CRYSTAL LAMINATE STRUCTURE

(71) Applicants: TAMURA CORPORATION, Tokyo (JP); National Institute of Information and Communications Technology, Koganei-shi, Tokyo (JP)

(72) Inventors: Kohei Sasaki, Tokyo (JP); Akito Kuramata, Tokyo (JP); Masataka Higashiwaki, Koganei (JP)

(73) Assignees: TAMURA CORPORATION, Tokyo (JP); NATIONAL INSTITUTE OF INFORMATION AND COMMUNICATIONS TECHNOLOGY, Koganei-Shi, Tokyo (JP)

( * ) Notice: Subject to any disclaimer, the term of this patent is extended or adjusted under 35 U.S.C. 154(b) by 0 days.

(21) Appl. No.: 15/328,791

(22) PCT Filed: Jul. 24, 2015

(86) PCT No.: PCT/JP2015/071114
§ 371 (c)(1),
(2) Date: Jan. 24, 2017

(87) PCT Pub. No.: WO2016/013658
PCT Pub. Date: Jan. 28, 2016

(65) Prior Publication Data
US 2017/0213918 A1 Jul. 27, 2017

(30) Foreign Application Priority Data
Jul. 25, 2014 (JP) .................................. 2014-152410

(51) Int. Cl.
*H01L 29/872* (2006.01)
*C30B 29/16* (2006.01)
(Continued)

(52) U.S. Cl.
CPC ............ *H01L 29/872* (2013.01); *C30B 15/34* (2013.01); *C30B 23/025* (2013.01);
(Continued)

(58) Field of Classification Search
CPC ............ H01L 29/66212; H01L 29/872; H01L 29/7869; H01L 29/78603; H01L 21/02565;
(Continued)

(56) References Cited

U.S. PATENT DOCUMENTS 6,686,616 B1    2/2004  Allen et al.
7,067,361 B2    6/2006  Allen et al.
(Continued)

FOREIGN PATENT DOCUMENTS

CN    1441965 A     9/2003
CN    103781948 A   5/2014
(Continued)

OTHER PUBLICATIONS

Notification of Transmittal of Translation of the International Preliminary Report on Patentability (PCT/IB/338) in PCT Application No. PCT/JP2015/071114 dated Feb. 9, 2017.
(Continued)

*Primary Examiner* — Latanya N Crawford
(74) *Attorney, Agent, or Firm* — McGinn I.P. Law Group, PLLC.

(57) ABSTRACT

A semiconductor element includes a base substrate that includes a $Ga_2O_3$-based crystal having a thickness of not less than 0.05 μm and not more than 50 μm, and an epitaxial layer that includes a $Ga_2O_3$-based crystal and is epitaxially
(Continued)

grown on the base substrate. A semiconductor element includes an epitaxial layer that includes a $Ga_2O_3$-based crystal including an n-type dopant, an ion implanted layer that is formed on a surface of the epitaxial layer and includes a higher concentration of n-type dopant than the epitaxial layer, an anode electrode connected to the epitaxial layer, and a cathode electrode connected to the ion implanted layer.

7 Claims, 35 Drawing Sheets

(51) Int. Cl.
H01L 29/78 (2006.01)
H01L 29/808 (2006.01)
H01L 29/812 (2006.01)
H01L 29/12 (2006.01)
H01L 29/24 (2006.01)
C30B 15/34 (2006.01)
C30B 23/02 (2006.01)
C30B 23/06 (2006.01)
C30B 25/18 (2006.01)
C30B 31/22 (2006.01)
C30B 33/08 (2006.01)
H01L 21/02 (2006.01)
H01L 21/425 (2006.01)
H01L 29/66 (2006.01)
H01L 29/786 (2006.01)

(52) U.S. Cl.
CPC .......... *C30B 23/066* (2013.01); *C30B 25/186* (2013.01); *C30B 29/16* (2013.01); *C30B 31/22* (2013.01); *C30B 33/08* (2013.01); *H01L 21/02565* (2013.01); *H01L 21/425* (2013.01); *H01L 29/12* (2013.01); *H01L 29/24* (2013.01); *H01L 29/66969* (2013.01); *H01L 29/78* (2013.01); *H01L 29/7869* (2013.01); *H01L 29/78603* (2013.01); *H01L 29/78642* (2013.01); *H01L 29/808* (2013.01); *H01L 29/812* (2013.01); H01L 21/02414 (2013.01); H01L 21/02433 (2013.01)

(58) Field of Classification Search
CPC . H01L 29/24; H01L 29/812; H01L 21/02433; H01L 21/02414; C30B 31/22; C30B 25/186; C30B 23/025; C30B 29/16
See application file for complete search history.

(56) References Cited

U.S. PATENT DOCUMENTS

| | | | |
|---|---|---|---|
| 8,191,792 B2 | 6/2012 | Bandoh | |
| 8,492,256 B2 | 7/2013 | Urano | |
| 9,171,947 B2 | 10/2015 | Morishita et al. | |
| 9,412,882 B2 | 8/2016 | Takizawa et al. | |
| 9,461,124 B2* | 10/2016 | Sasaki | H01L 29/7813 |
| 9,716,004 B2 | 7/2017 | Sasaki | |
| 2004/0159865 A1 | 8/2004 | Allen et al. | |
| 2007/0082467 A1 | 4/2007 | Hata et al. | |
| 2008/0043803 A1 | 2/2008 | Bandoh | |
| 2009/0078943 A1 | 3/2009 | Ishida et al. | |
| 2011/0256668 A1 | 10/2011 | Urano | |
| 2014/0217405 A1* | 8/2014 | Sasaki | H01L 29/7813 257/43 |
| 2014/0217554 A1 | 8/2014 | Sasaki | |
| 2014/0220734 A1 | 8/2014 | Sasaki | |
| 2014/0332823 A1 | 11/2014 | Takizawa et al. | |
| 2015/0279927 A1* | 10/2015 | Hitora | H01L 21/02565 257/43 |
| 2016/0043238 A1 | 2/2016 | Takizawa et al. | |
| 2016/0322467 A1 | 11/2016 | Takizawa et al. | |

FOREIGN PATENT DOCUMENTS

| | | | | |
|---|---|---|---|---|
| JP | H 05-243277 A | 9/1993 | | |
| JP | H 06-155284 A | 6/1994 | | |
| JP | 2003-152138 A | 5/2003 | | |
| JP | 2003-533051 A | 11/2003 | | |
| JP | 2005-129825 A | 5/2005 | | |
| JP | 2006-203071 A | 8/2006 | | |
| JP | 2007-096090 A | 4/2007 | | |
| JP | 2008-032697 A | 2/2008 | | |
| JP | 2009-076694 A | 4/2009 | | |
| JP | 2010-126372 A | 6/2010 | | |
| JP | 2010-177378 A | 8/2010 | | |
| JP | 2011-222898 A | 11/2011 | | |
| JP | WO 2013035845 A1 * | 3/2013 | ......... | H01L 29/7813 |
| JP | 2013-102081 A | 5/2013 | | |
| JP | 2013-149798 A | 8/2013 | | |
| WO | WO 2013-035464 A1 | 3/2013 | | |
| WO | WO 2013-035465 A1 | 3/2013 | | |

OTHER PUBLICATIONS

International Search Report (ISR) (PCT Form PCT/ISA/210), in PCT/JP2015/71114, dated Oct. 27, 2015.
Japanese Office Action, dated Jun. 5, 2018, in Japanese Application No. 2016-129307 and Partial English Translation thereof.
Japanese Office Action dated Dec. 5, 2017, in Japanese Application No. 2016-129307 with a partial English translation thereof.
Chinese Office Action, dated Oct. 12, 2018, in Chinese Application No. 201580041387.8 and English Translation thereof.

\* cited by examiner

SEMICONDUCTOR ELEMENT, METHOD FOR MANUFACTURING SAME, SEMICONDUCTOR SUBSTRATE, AND CRYSTAL LAMINATE STRUCTURE

TECHNICAL FIELD

The invention relates to a semiconductor element, a method for manufacturing the semiconductor element, a semiconductor substrate and a crystal laminate structure.

BACKGROUND ART

A $Ga_2O_3$-based Schottky diode having an $n^+$ semiconductor layer containing a high concentration of n-type dopant and an $n^-$ semiconductor layer formed thereon and containing a relatively low concentration of n-type dopant is known as a conventional semiconductor element (see, e.g., PTL 1). Both the $n^+$ semiconductor layer and the $n^-$ semiconductor layer are formed of a $Ga_2O_3$-based semiconductor.

In this Schottky diode, the $n^+$ semiconductor layer is in ohmic contact with an electrode connected thereto, and the $n^-$ semiconductor layer is in Schottky contact with another electrode connected thereto.

CITATION LIST

Patent Literature

[PTL 1]
JP-A-2013-102081

SUMMARY OF INVENTION

Technical Problem

In PTL 1, a $\beta$-$Ga_2O_3$-based substrate is used as the $n^+$ semiconductor layer, and the thickness of the $\beta$-$Ga_2O_3$-based substrate is as large as 600 μm. Since the thermal conductivity of $Ga_2O_3$ is lower than that of generally known semiconductor materials such as Si or GaAs, $Ga_2O_3$-based elements including a $Ga_2O_3$ substrate generate more heat to a certain amount of electric current than the same thick elements including a Si substrate.

For this reason, in the Schottky diode disclosed in PTL 1, it is difficult to dissipate heat generated during operation through the $n^+$ semiconductor layer side, so that heat dissipation property thereof becomes poor. Also, it is difficult to improve the heat dissipation property by reducing the thickness of the $n^+$ semiconductor layer since a great decrease in withstand voltage property can be caused thereby.

Thus, it is an object of an invention to provide a $Ga_2O_3$-based semiconductor element that has excellent heat dissipation property and withstand voltage property, as well as a method for manufacturing the semiconductor element, and a semiconductor substrate and a crystal laminate structure that are available for manufacturing the semiconductor element.

Solution to Problem

To attain the above object, according to an embodiment of the invention, a semiconductor element defined by [1] to [8] below is provided.

[1] A semiconductor element, comprising:
a base substrate that comprises a $Ga_2O_3$-based crystal having a thickness of not less than 0.05 μm and not more than 50 μm; and an epitaxial layer that comprises a $Ga_2O_3$-based crystal and is epitaxially grown on the base substrate.

[2] The semiconductor element according to [1], wherein the thickness of the base substrate is less than 10 μm.

[3] The semiconductor element according to [1] or [2], wherein a plane orientation of a principal surface of the base substrate is (010).

[4] The semiconductor element according to [1] or [2], comprising a vertical element, wherein the base substrate and the epitaxial layer provide a current path.

[5] The semiconductor element according to [1] or [2], comprising a lateral element, wherein the base substrate does not provide a current path.

[6] The semiconductor element according to [1] or [2], wherein the base substrate and the epitaxial layer are each attached to other substrates.

[7] A semiconductor element, comprising:
an epitaxial layer that comprises a $Ga_2O_3$-based crystal including an n-type dopant;
an ion implanted layer that is formed on a surface of the epitaxial layer and includes a higher concentration of n-type dopant than the epitaxial layer;
an anode electrode connected to the epitaxial layer; and
a cathode electrode connected to the ion implanted layer.

[8] The semiconductor element according to [7], wherein the epitaxial layer and the ion implanted layer are each attached to other substrates.

To attain the above object, according to another embodiment of the invention, a semiconductor element defined by [9] to [14] below is provided.

[9] A method for manufacturing a semiconductor element, comprising:
forming an epitaxial layer by epitaxially growing a $Ga_2O_3$-based crystal on a base substrate comprising a $Ga_2O_3$-based crystal; and
reducing a thickness of the base substrate to not less than 0.05 μm and not more than 50 μm.

[10] The method for manufacturing a semiconductor element according to [9], wherein the thickness of the base substrate is reduced to less than 10 μm.

[11] The method for manufacturing a semiconductor element according to [9], wherein the thickness of the base substrate is reduced by polishing.

[12] The method for manufacturing a semiconductor element according to [9] or [10], wherein the thickness of the base substrate is reduced by polishing and etching after the polishing.

[13] The method for manufacturing a semiconductor element according to [9], wherein the epitaxial layer includes an n-type dopant, and
wherein after the base substrate is reduced in thickness and eventually removed, ions of an n-type dopant are implanted into a surface of the epitaxial layer on the side on which the base substrate was located, so that an ion implanted layer containing a higher concentration of n-type dopant than the epitaxial layer is formed on the surface.

[14] The method for manufacturing a semiconductor element according to any one of [9] to [11] and [13], wherein the thickness of the base substrate is reduced while the epitaxial layer is attached to a supporting substrate.

To attain the above object, according to another embodiment of the invention, a semiconductor element defined by [15] and [16] below is provided.

[15] A semiconductor substrate, comprising a $Ga_2O_3$-based crystal, wherein the semiconductor substrate has a thickness of not less than 0.05 μm and not more than 50 μm.

[16] The semiconductor substrate according to [15], wherein a plane orientation of a principal surface thereof is (010).

To attain the above object, according to another embodiment of the invention, a semiconductor element defined by [17] to [19] below is provided.

[17] A crystal laminate structure, comprising:
a base substrate that comprises a $Ga_2O_3$-based crystal having a thickness of not less than 0.05 μm and not more than 50 μm; and
an epitaxial layer that comprises a $Ga_2O_3$-based crystal and is epitaxially grown on the base substrate.

[18] The crystal laminate structure according to [17], wherein the thickness of the base substrate is less than 10 μm.

[19] The crystal laminate structure according to [17] or [18], wherein a plane orientation of a principal surface of the base substrate is (010).

Advantageous Effects of Invention

According to the invention, a $Ga_2O_3$-based semiconductor element can be provided that has excellent heat dissipation property and withstand voltage property, as well as a method for manufacturing the semiconductor element, and a semiconductor substrate and a crystal laminate structure that are available for manufacturing the semiconductor element.

DESCRIPTION OF EMBODIMENTS

First Embodiment

The first embodiment is a vertical semiconductor element, implemented as a Schottky diode.

(Structure of Semiconductor Element)

Figure 1:
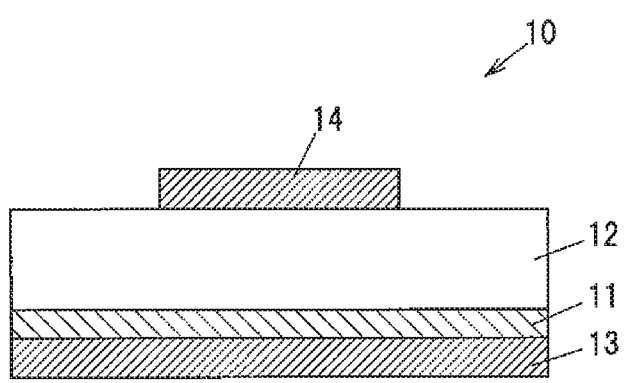
FIG. 1 is a vertical cross-sectional view showing a Schottky diode in a first embodiment.

FIG. 1 is a vertical cross-sectional view showing a Schottky diode 10 in the first embodiment. The Schottky diode 10 is provided with a base substrate 11, an epitaxial layer 12 formed on the base substrate 11 by epitaxial growth, a cathode electrode 13 formed on a lower surface of the base substrate 11 (a surface opposite to the surface in contact with the epitaxial layer 12) and in ohmic contact with the base substrate 11, and an anode electrode 14 formed on an upper surface of the epitaxial layer 12 (a surface opposite to the surface in contact with the base substrate 11) and in Schottky contact with the epitaxial layer 12.

In the Schottky diode 10, a Schottky barrier height at an interface between the anode electrode 14 and the epitaxial layer 12 is lowered by applying forward bias between the anode electrode 14 and the cathode electrode 13 and current flows from the anode electrode 14 to the cathode electrode 13. On the other hand, when reverse bias is applied between the anode electrode 14 and the cathode electrode 13, the Schottky barrier height at the interface between the anode electrode 14 and the epitaxial layer 12 is increased and the current does not flow.

The base substrate 11 and the epitaxial layer 12 are formed of a $Ga_2O_3$-based crystal and contain an n-type dopant. The n-type dopant is preferably a Group IV element such as Si or Sn. The n-type dopant concentration of the base substrate 11 is higher than the n-type dopant concentration of the epitaxial layer 12.

The $Ga_2O_3$-based crystal here is a $Ga_2O_3$ crystal, or is a $Ga_2O_3$ crystal containing substitutional impurities such as Al or In. The $Ga_2O_3$-based crystal is preferably a single crystal. The $Ga_2O_3$-based crystal is also preferably in β-form.

The base substrate 11 is reduced in thickness during the manufacturing process of the Schottky diode 10 and is thus thinner than base substrates conventionally used to form semiconductor elements. Since the base substrate 11 is thin, heat generated in the Schottky diode 10 can be efficiently released through the base substrate 11. The Schottky diode 10 thus has excellent heat dissipation property. The thickness of the base substrate 11 is preferably not more than 50 μm so that the heat dissipation effect is further enhanced. The thinner the base substrate 11 is, the better the heat dissipation property of the Schottky diode 10 becomes.

In case that the thickness of the base substrate 11 is reduced by polishing, the base substrate 11 is preferably processed to a thickness of not less than 10 μm so that thickness variation on a substrate surface is suppressed.

In case that etching is performed after the polishing to further reduce the thickness of the base substrate 11, the base substrate 11 can be processed to a thickness of less than 10 μm to further enhance the heat dissipation effect. The thickness of the base substrate 11, however, is preferably not less than 0.05 μm so as to have an ohmic contact with the cathode electrode 13.

The $Ga_2O_3$-based crystals have a higher breakdown field strength than semiconductor materials generally used to form conventional semiconductor substrates or semiconductor layers, such as Si, SiC or GaN, and allows the epitaxial layer 12 to have a reduced thickness while suppressing a decrease in withstand voltage property of the Schottky diode 10, resulting in that the thickness of the entire Schottky diode 10 can be reduced and also heat dissipation can be further improved. As such, the Schottky diode 10 has both high heat dissipation property and high withstand voltage property.

The principal surface of the base substrate 11 is, e.g., a surface rotated not less than 50° and not more than 90° from the (100) plane of the β-Ga$_2$O$_3$-based single crystal. In other words, an angle θ (0<θ≤90°) formed between the principal surface of the base substrate 11 and the (100) plane is not less than 50°. Examples of the surface rotated not less than 50° and not more than 90° from the (100) plane include a (010) plane, a (001) plane, a (−201) plane, a (101) plane and a (310) plane.

When the principal surface of the base substrate 11 is a surface rotated not less than 50° and not more than 90° from the (100) plane, it is possible to effectively suppress re-evaporation of raw materials of the β-Ga$_2$O$_3$-based crystal from the base substrate 11 at the time of epitaxially growing the β-Ga$_2$O$_3$-based crystal on the base substrate 11. In detail, where a percentage of the re-evaporated raw material during growth of the β-Ga$_2$O$_3$-based crystal at a growth temperature of 500° C. is defined as 0%, the percentage of the re-evaporated raw material can be suppressed to not more than 40% when the principal surface of the base substrate 11 is a surface rotated not less than 50° and not more than 90° from the (100) plane. It is thus possible to use not less than 60% of the supplied raw material to form the β-Ga$_2$O$_3$-based crystal, which is preferable from the viewpoint of growth rate and manufacturing cost of the β-Ga$_2$O$_3$-based crystal.

In the β-Ga$_2$O$_3$ crystal, the (100) plane comes to coincide with the (310) plane when rotated by 52.5° about the c-axis and comes to coincide with the (010) plane when rotated by 90°. Meanwhile, the (100) plane comes to coincide with the (101) plane when rotated by 53.8° about the b-axis, comes to coincide with the (001) plane when rotated by 76.3° and comes to coincide with the (−201) plane when rotated by 53.8°.

Alternatively, the principal surface of the base substrate 11 is the (010) plane, or a surface rotated within an angle range of not more than 37.5° with respect to the (010) plane. In this case, it is possible to provide a steep interface between the base substrate 11 and the epitaxial layer 12 and it is also possible to highly accurately control the thickness of the epitaxial layer 12. In addition, it is possible to prevent uneven element uptake by the epitaxial layer 12 and thereby to obtain the homogeneous epitaxial layer 12. Note that, the (010) plane comes to coincide with the (310) plane when rotated by 37.5° about the c-axis.

Meanwhile, the β-Ga$_2$O$_3$-based crystal is known to have a high thermal conductivity in a direction (the b-axis direction). For example, a β-Ga$_2$O$_3$ crystal has a thermal conductivity of 13.6 W/(m·k) in the [100] direction (the a-axis direction), but has a thermal conductivity of 22.8 W/(m·k) in the [010] direction (the b-axis direction) which is nearly double the thermal conductivity in the [100] direction.

Based on this, the thermal conductivity of the base substrate 11 in the thickness direction can be increased by using the base substrate 11 with a (010)-oriented principal surface. Therefore, the plane orientation of the principal surface of the base substrate 11 is preferably (010).

The thickness of the epitaxial layer 12 is, e.g., 0.4 to 30 μm.

The anode electrode 14 is formed of a metal such as Pt or Ni. The anode electrode 14 may have a laminated structure formed by laminating different metal films, such as Pt/Au or Pt/Al. The epitaxial layer 12 may additionally have an electrode termination structure. The electrode termination structure can be, e.g., a field-plate structure configured that insulating films are formed on the surface of the epitaxial layer 12 on both sides of the anode electrode 14, a guard ring structure formed by implanting acceptor ions into a surface of the epitaxial layer 12 on both sides of the anode electrode 14, a mesa structure configured that portions of the epitaxial layer 12 on both sides of the anode electrode 14 are removed, or a combination thereof.

The cathode electrode 13 is formed of a metal such as Ti. The cathode electrode 13 may have a laminated structure formed by laminating different metal films, such as Ti/Au or Ti/Al.

A method for manufacturing the Schottky diode 10 in the first embodiment will be described below, along with specific examples. However, the method for manufacturing the Schottky diode 10 is not limited to the examples described below.

(Semiconductor Element Manufacturing Method 1)

FIGS. 2A to 2D, 3A and 3B are vertical cross-sectional views showing an exemplary process of manufacturing the Schottky diode 10 in the first embodiment. In the example shown in FIGS. 2A to 2D, 3A and 3B, the thickness of the base substrate 11 is reduced by polishing.

Figure 2A:
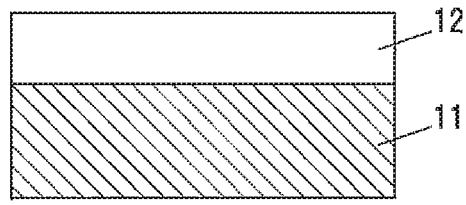
FIG. 2A is a vertical cross-sectional view showing an exemplary process of manufacturing the Schottky diode in the first embodiment.

Firstly, as shown in FIG. 2A, the epitaxial layer 12 is formed on the base substrate 11.

To obtain the base substrate 11, for example, a β-Ga$_2$O$_3$ single crystal which is grown by the EFG method and contains a high concentration of n-type dopant is sliced and polished to a desired thickness. The thickness of the base substrate 11 before polishing is, e.g., 600 μm.

The epitaxial layer 12 is formed by epitaxially growing a β-Ga$_2$O$_3$ single crystal on the base substrate 11 using, e.g., the HYPE method, the PLD (Pulsed Laser Deposition) method, the CVD (Chemical Vapor Deposition) method or the molecular beam epitaxy (MBE) method.

The method of introducing the n-type dopant into the epitaxial layer 12 is, e.g., epitaxial growth of a Ga$_2$O$_3$ crystal film containing an n-type dopant, or ion implantation of an n-type dopant into a grown Ga$_2$O$_3$ crystal film.

Figure 2B:
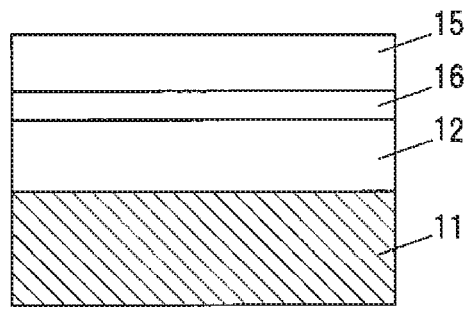
FIG. 2B is a vertical cross-sectional view showing the exemplary process of manufacturing the Schottky diode in the first embodiment.

Next, as shown in FIG. 2B, the epitaxial layer 12 is attached to a supporting substrate 15 via an adhesive layer 16 formed of resin, etc.

The material of the supporting substrate 15 used here is, e.g., metal, resin or ceramic, etc., but it is not limited thereto.

Figure 2C:
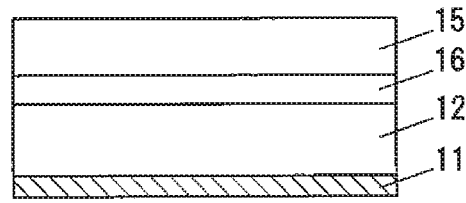
FIG. 2C is a vertical cross-sectional view showing the exemplary process of manufacturing the Schottky diode in the first embodiment.

Next, as shown in FIG. 2C, the thickness of the base substrate 11 supported by the supporting substrate 15 is reduced to not less than 10 μm and not more than 50 μm by polishing.

The polishing performed on the base substrate 11 is, e.g., CMP (Chemical Mechanical Polishing) using a colloidal silica slurry.

The base substrate 11 may be separated from the supporting substrate 15 after reducing the thickness. In this case, a crystal laminate structure is obtained, which has the base substrate 11 formed of a Ga$_2$O$_3$-based crystal and having a thickness of not less than 10 μm and not more than 50 μm and the epitaxial layer 12 formed of a Ga$_2$O$_3$-based crystal and epitaxially grown on the base substrate 11.

Figure 2D:
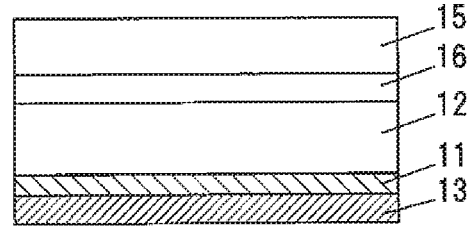
FIG. 2D is a vertical cross-sectional view showing the exemplary process of manufacturing the Schottky diode in the first embodiment.

Next, as shown in FIG. 2D, the cathode electrode 13 is formed on the lower surface of the base substrate 11 (a surface opposite to the surface in contact with the epitaxial layer 12).

To form the cathode electrode 13, for example, a mask pattern is formed on the base substrate 11 by photolithography, a metal film of Ti/Au, etc., is then deposited on the whole surface of the base substrate 11, and the mask pattern and the metal film thereon are removed by lift-off.

Since the base substrate 11 contains a high concentration of n-type dopant, the base substrate 11 is in ohmic contact with the cathode electrode 13.

Figure 3A:
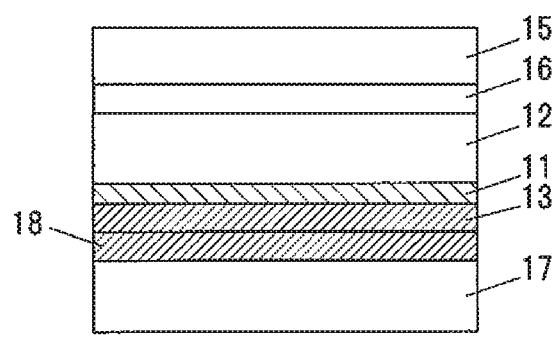
FIG. 3A is a vertical cross-sectional view showing the exemplary process of manufacturing the Schottky diode in the first embodiment.

Next, as shown in FIG. 3A, a supporting substrate 17 having an electrode 18 on one side is prepared, and the base substrate 11 is attached to the supporting substrate 17 by bonding the cathode electrode 13 to the electrode 18.

The material of the supporting substrate 17 is not specifically limited. However, the supporting substrate 17, when kept as a supporting substrate of the Schottky diode 10 as described later, is preferably formed of a material having a higher thermal conductivity than $\beta$-$Ga_2O_3$, e.g., a metal such as Al, a nitride such as AlN, SiN or GaN, an oxide such as $SiO_2$ or $Al_2O_3$, or, SiC, Si, GaAs or diamond, etc. The electrode 18 is formed of, e.g., Au. The cathode electrode 13 is bonded to the electrode 18 by applying, e.g., pressure, heat, the combination of pressure with ultrasonic vibration, or, pressure and the combination of pressure with ultrasonic vibration.

Figure 3B:
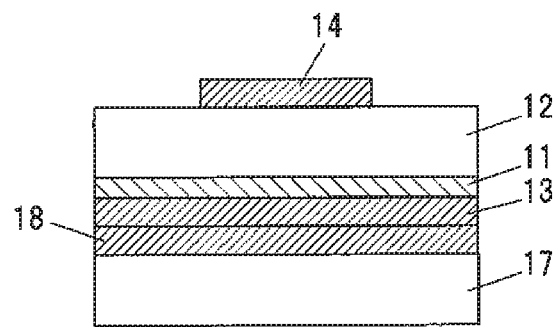
FIG. 3B is a vertical cross-sectional view showing the exemplary process of manufacturing the Schottky diode in the first embodiment.

Next, as shown in FIG. 3B, the epitaxial layer 12 supported by the supporting substrate 17 is separated from the supporting substrate 15 and the adhesive layer 16, and the anode electrode 14 is then formed on the upper surface of the epitaxial layer 12 (a surface opposite to the surface in contact with the base substrate 11).

To form the anode electrode 14, for example, a mask pattern is formed on the epitaxial layer 12 by photolithography, a metal film of Pt/Au, etc., is then deposited on the whole surface of the epitaxial layer 12, and the mask pattern and the metal film thereon are removed by lift-off.

Since the epitaxial layer 12 contains a low concentration of n-type dopant, the epitaxial layer 12 is in Schottky contact with the anode electrode 14.

In this manufacturing method, since the anode electrode 14 is formed after polishing the base substrate 11, damage on the anode electrode 14 during polishing of the base substrate 11 will never occur and it is thus possible to improve the yield of the Schottky diode 10.

The supporting substrate 17 may be kept as a supporting substrate of the finished Schottky diode 10. In this case, external power may be supplied to the cathode electrode 13 through the electrode 18 of the supporting substrate 17. In case that the supporting substrate 17 is electrically conductive, external power may be supplied to the cathode electrode 13 through the supporting substrate 17 and the electrode 18. Alternatively, the Schottky diode 10 may be separated from the supporting substrate 17 and then attached to another supporting substrate.

(Semiconductor Element Manufacturing Method 2)

Figure 4A:
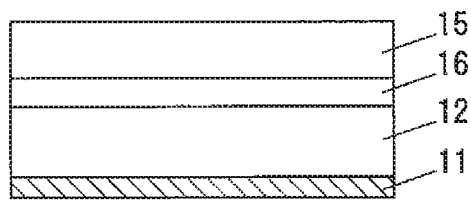
FIG. 4A is a vertical cross-sectional view showing an exemplary process of manufacturing the Schottky diode in the first embodiment.
Figure 4B:
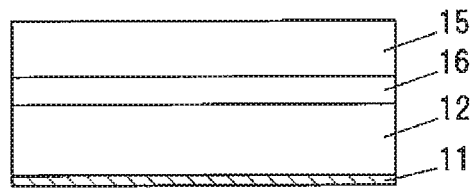
FIG. 4B is a vertical cross-sectional view showing the exemplary process of manufacturing the Schottky diode in the first embodiment.
Figure 4C:
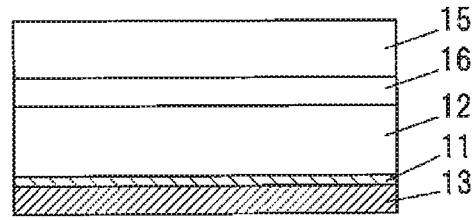
FIG. 4C is a vertical cross-sectional view showing the exemplary process of manufacturing the Schottky diode in the first embodiment.

FIGS. 4A to 4C are vertical cross-sectional views showing an exemplary process of manufacturing the Schottky diode 10 in the first embodiment. In the example shown in FIGS. 4A to 4C, the thickness of the base substrate 11 is reduced by polishing and subsequent etching.

Firstly, the process until polishing to reduce the thickness of the base substrate 11 shown in FIG. 2A to 2C is performed as shown in FIG. 4A.

Next, as shown in FIG. 4B, the thickness of the base substrate 11 supported by the supporting substrate 15 is further reduced by etching. The thickness of the base substrate 11 can be reduced to less than 10 µm by this etching.

The etching performed on the base substrate 11 is, e.g., dry etching such as RIE (Reactive Ion Etching) or wet etching using $H_2SO_4$ or $H_3PO_4$, etc., as an etchant.

The base substrate 11 may be separated from the supporting substrate 15 after reducing the thickness. In this case a crystal laminate structure is obtained, which has the base substrate 11 formed of a $Ga_2O_3$-based crystal and having a thickness of not less than 0.05 µm and not more than 50 µm and the epitaxial layer 12 formed of a $Ga_2O_3$-based crystal and epitaxially grown on the base substrate 11.

Next, as shown in FIG. 4C, the cathode electrode 13 is formed on the lower surface of the base substrate 11.

After that, the base substrate 11 is attached to the supporting substrate 17, the epitaxial layer 12 is separated from the supporting substrate 15 and the adhesive layer 16, and the anode electrode 14 is then formed, in the same manner as the process shown in FIGS. 3A and 3B.

(Semiconductor Element Manufacturing Method 3)

FIGS. 5A to 5E are vertical cross-sectional views showing an exemplary process of manufacturing the Schottky diode 10 in the first embodiment. In the example shown in FIGS. 5A to 5E, the thickness of the base substrate 11 is reduced by polishing.

Figure 5A:
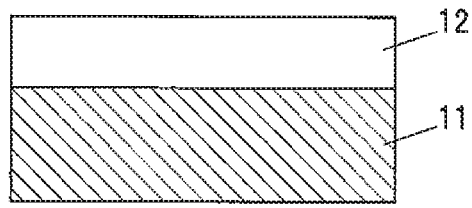
FIG. 5A is a vertical cross-sectional view showing an exemplary process of manufacturing the Schottky diode in the first embodiment.

Firstly, as shown in FIG. 5A, the epitaxial layer 12 is formed on the base substrate 11.

Figure 5B:
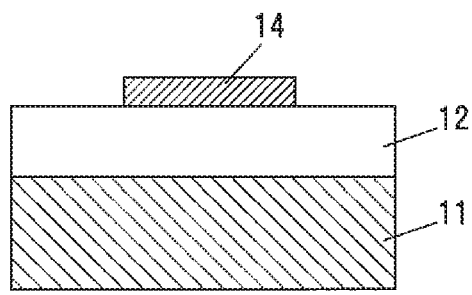
FIG. 5B is a vertical cross-sectional view showing the exemplary process of manufacturing the Schottky diode in the first embodiment.

Next, as shown in FIG. 5B, the anode electrode 14 is formed on the upper surface of the epitaxial layer 12 (a surface opposite to the surface in contact with the base substrate 11).

Figure 5C:
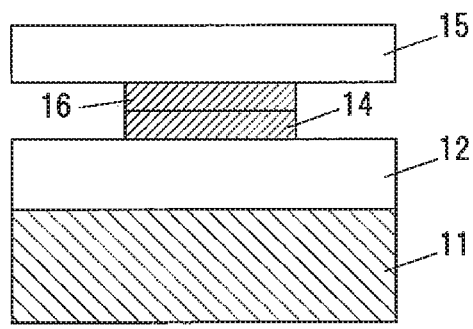
FIG. 5C is a vertical cross-sectional view showing the exemplary process of manufacturing the Schottky diode in the first embodiment.

Next, as shown in FIG. 5C, the supporting substrate 15 having an electrode 19 on one side is prepared, and the epitaxial layer 12 is attached to the supporting substrate 15 by bonding the anode electrode 14 to the electrode 19. The material of the supporting substrate 15 is not specifically limited. However, the supporting substrate 15, when kept as a supporting substrate of the Schottky diode 10 as described later, is preferably formed of a material having a higher thermal conductivity than $\beta$-$Ga_2O_3$, e.g., a metal such as Al, a nitride such as AlN, SiN or GaN, an oxide such as $SiO_2$ or $Al_2O_3$, or, SiC, Si, GaAs or diamond, etc.

The electrode 19 is formed of, e.g., Au. The anode electrode 14 is bonded to the electrode 19 by applying, e.g., pressure, heat, the combination of pressure with ultrasonic vibration, or, pressure and the combination of pressure with ultrasonic vibration.

Figure 5D:
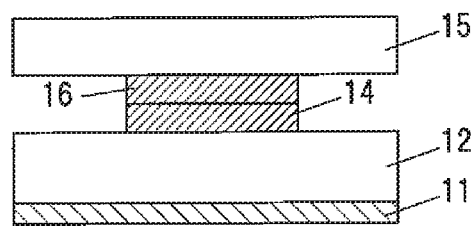
FIG. 5D is a vertical cross-sectional view showing the exemplary process of manufacturing the Schottky diode in the first embodiment.

Next, as shown in FIG. 5D, the thickness of the base substrate 11 supported by the supporting substrate 15 is reduced to not less than 10 µm and not more than 50 µm by polishing.

Figure 5E:
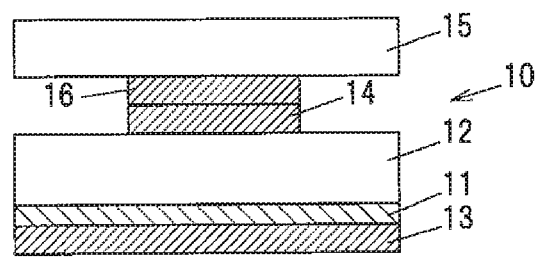
FIG. 5E is a vertical cross-sectional view showing the exemplary process of manufacturing the Schottky diode in the first embodiment.

Next, as shown in FIG. 5E, the cathode electrode 13 is formed on the lower surface of the base substrate 11 (a surface opposite to the surface in contact with the epitaxial layer 12).

The supporting substrate 15 may be kept as a supporting substrate of the finished Schottky diode 10. In this case, external power may be supplied to the anode electrode 14 through the electrode 19 of the supporting substrate 15. In case that the supporting substrate 15 is electrically conductive, external power may be supplied to the anode electrode 14 through the supporting substrate 15 and the electrode 19. Alternatively, the Schottky diode 10 may be separated from the supporting substrate 15 and then attached to another supporting substrate.

(Semiconductor Element Manufacturing Method 4)

Figure 6A:
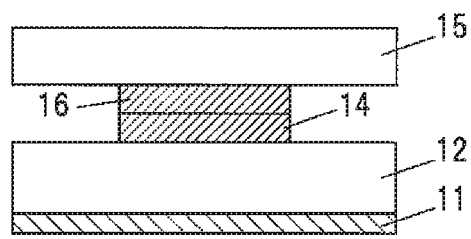
FIG. 6A is a vertical cross-sectional view showing an exemplary process of manufacturing the Schottky diode in the first embodiment.
Figure 6B:
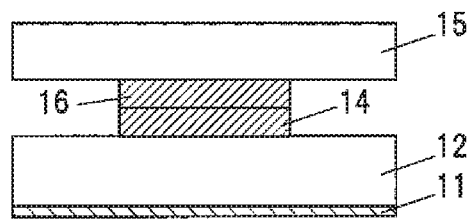
FIG. 6B is a vertical cross-sectional view showing the exemplary process of manufacturing the Schottky diode in the first embodiment.
Figure 6C:
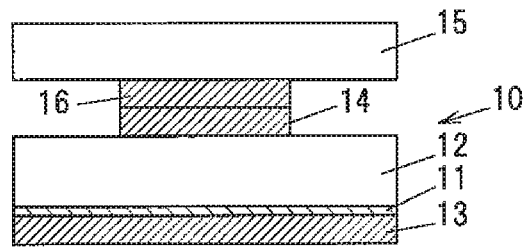
FIG. 6C is a vertical cross-sectional view showing the exemplary process of manufacturing the Schottky diode in the first embodiment.

FIGS. 6A to 6C are vertical cross-sectional views showing an exemplary process of manufacturing the Schottky diode 10 in the first embodiment. In the example shown in FIGS. 6A to 6C, the thickness of the base substrate 11 is reduced by polishing and subsequent etching.

Firstly, the process until polishing to reduce the thickness of the base substrate 11 shown in FIG. 5A to 5D is performed as shown in FIG. 6A.

Next, as shown in FIG. 6B, the thickness of the base substrate 11 supported by the supporting substrate 15 is further reduced by etching. The thickness of the base substrate 11 can be reduced to less than 10 µm by this etching.

Next, as shown in FIG. 6C, the cathode electrode 13 is formed on the lower surface of the base substrate 11.

The anode electrode 14 may be formed after the base substrate 11 is polished and etched.

Second Embodiment

The second embodiment is a vertical semiconductor element, implemented as a vertical transistor having a MISFET (Metal Insulator Semiconductor Field Effect Transistor) structure.

(Structure of Semiconductor Element)

Figure 7:
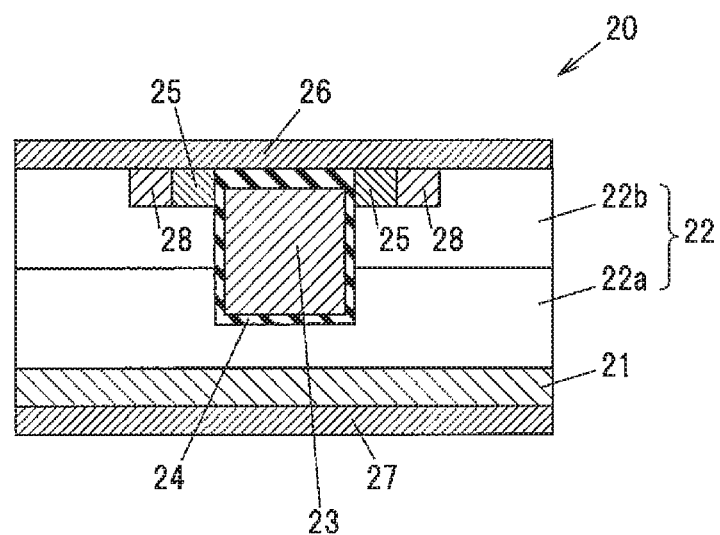
FIG. 7 is a vertical cross-sectional view showing a vertical transistor in a second embodiment.

FIG. 7 is a vertical cross-sectional view showing a vertical transistor 20 in the second embodiment. The vertical transistor 20 is provided with an epitaxial layer 22 formed on a base substrate 21, a gate electrode 23 covered with a gate insulating film 24 and embedded in the epitaxial layer 22, contact regions 25 formed in the epitaxial layer 22 so as to be located on both sides of the gate electrode 23, $p^+$ regions 28 formed on respective sides of the contact regions 25, a source electrode 26 formed on the epitaxial layer 22 and connected to the contact regions 25, and a drain electrode 27 formed on a surface of the base substrate 21 on the opposite side to the epitaxial layer 22.

The vertical transistor 20 is a vertical semiconductor element in which the source electrode 26 and the drain electrode 27 are arranged respectively on and under the element and a current thus flows in a vertical direction. When voltage not less than the threshold is applied to the gate electrode 23, channels are formed in the epitaxial layer 22 in regions on both sides of the gate electrode 23, allowing a current to flow from the source electrode 26 to the drain electrode 27.

The base substrate 21 is formed of a $Ga_2O_3$-based crystal and contains an n-type dopant. The n-type dopant is preferably a Group IV element such as Si or Sn. The n-type dopant concentration of the base substrate 21 is higher than the n-type dopant concentration of the epitaxial layer 22.

The thickness of the base substrate 21 is the same as the thickness of the base substrate 11 in the first embodiment. Since the base substrate 21 is thin, heat generated in the vertical transistor 20 can be efficiently released through the base substrate 21. The vertical transistor 20 thus has excellent heat dissipation property.

The epitaxial layer 22 is formed of a $Ga_2O_3$-based crystal having a high breakdown field strength, and thus can have a smaller thickness than elements formed using other semiconductor materials while suppressing a decrease in withstand voltage property of the vertical transistor 20, resulting in that the thickness of the entire vertical transistor 20 can be reduced and also heat dissipation can be further improved. As such, the vertical transistor 20 has both high heat dissipation property and high withstand voltage property.

The plane orientation of the principal surface of the base substrate 21 is also the same as that of the base substrate 11 in the first embodiment, and (010) is especially preferable.

The epitaxial layer 22 is formed of a $Ga_2O_3$-based crystal and has a laminated structure in which a layer 22b undoped or containing a p-type dopant is deposited on a layer 22a containing a low concentration of n-type dopant. The n-type dopant is preferably a Group IV element such as Si or Sn. The p-type dopant is preferably Fe or a Group II element such as Be, Mg or Zn. The gate electrode 23 is formed mainly in the layer 22b.

The thickness of the layer 22a containing a low concentration of n-type dopant is, e.g., 0.4 to 40 μm, and the thickness of the layer 22b undoped or containing a p-type dopant is, e.g., 0.1 to 10 μm.

The gate electrode 23, the source electrode 26 and the drain electrode 27 are formed of, e.g., a metal such as Au, Al, Ti, Sn, Ge, In, Ni, Co, Pt, W, Mo, Cr, Cu or Pb, an alloy containing two or more of such metals, a conductive compound such as ITO, or a conductive polymer. The conductive polymer to be used is, e.g., a polythiophene derivative (PEDOT: poly(3,4)-ethylenedioxythiophene) doped with polystyrene sulfonate (PSS) or a polypyrrole derivative doped with TCNA, etc. The gate electrode 23 may alternatively have a two-layer structure composed of two different metals, e.g., Al/Ti, Au/Ni or Au/Co.

The gate insulating film 24 is formed of an insulating material such as $SiO_2$, AlN, SiN, $Al_2O_3$ or $\beta\text{-}(Al_xGa_{1-x})_2O_3$ ($0 \leq x \leq 1$). Of those, the $\beta\text{-}(Al_xGa_{1-x})_2O_3$ can be grown as a single crystal film on a $\beta\text{-}Ga_2O_3$ crystal and allows a good semiconductor-insulating film interface with less interface states to be formed, resulting in that better gate characteristics than when using other insulating films are obtained.

The contact regions 25 are high n-type dopant concentration regions formed in the layer 22b of the epitaxial layer 22. The $p^+$ regions 28 are high p-type dopant concentration regions formed in the layer 22b of the epitaxial layer 22. Both the contact regions 25 and the $p^+$ regions 28 are in ohmic contact with the source electrode 26.

A method for manufacturing the vertical transistor 20 in the second embodiment will be described below, along with specific examples. However, the method for manufacturing the vertical transistor 20 is not limited to the examples described below.

(Semiconductor Element Manufacturing Method 1)

FIGS. 8A to 8D, and 9A to 9D are vertical cross-sectional views showing an exemplary process of manufacturing the vertical transistor 20 in the second embodiment. In the example shown in FIGS. 8A to 8D, and 9A to 9D, the thickness of the base substrate 21 is reduced by polishing.

Figure 8A:
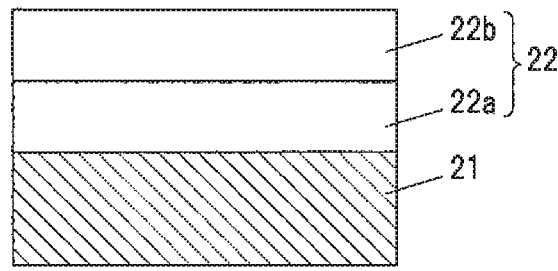
FIG. 8A is a vertical cross-sectional view showing an exemplary process of manufacturing the vertical transistor in the second embodiment.

Firstly, as shown in FIG. 8A, the epitaxial layer 22 is formed on the base substrate 21.

The base substrate 21 is the same substrate as the base substrate 11 in the first embodiment and has a thickness of, e.g., 600 μm before polishing. The process of forming the epitaxial layer 22 is similar to the process of forming the epitaxial layer 12 in the first embodiment but is different in that the dopant to be doped is changed during the epitaxial growth so that the layer 22a and the layer 22b are formed.

Figure 8B:
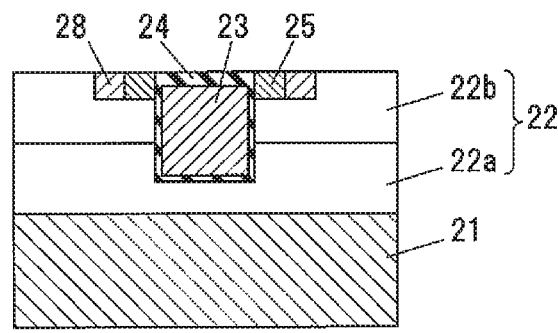
FIG. 8B is a vertical cross-sectional view showing the exemplary process of manufacturing the vertical transistor in the second embodiment.

Next, the gate electrode 23, the gate insulating film 24, the contact regions 25 and the $p^+$ regions 28 are formed in the epitaxial layer 22, as shown in FIG. 8B.

Firstly, ions of an n-type dopant are implanted at a high dose into the upper surface of the epitaxial layer 22 (a surface opposite to the surface in contact with the base substrate 21) to form the contact region 25. Ions of a p-type dopant are also implanted at a high dose to form the $p^+$ regions 28. Then, implantation damage is repaired by annealing in an atmosphere of nitrogen, etc.

Subsequently, a trench is formed on the epitaxial layer 22 by dry etching so as to split the contact region 25, and the gate electrode 23 covered with the gate insulating film 24 is embedded in the trench. In detail, for example, the gate insulating film 24 is formed on the bottom and side surfaces of the trench by deposition and etching, the gate electrode 23 is formed thereon by deposition and etching, and lastly, the gate insulating film 24 is formed on the top of the gate electrode 23 by deposition and etching.

Figure 8C:
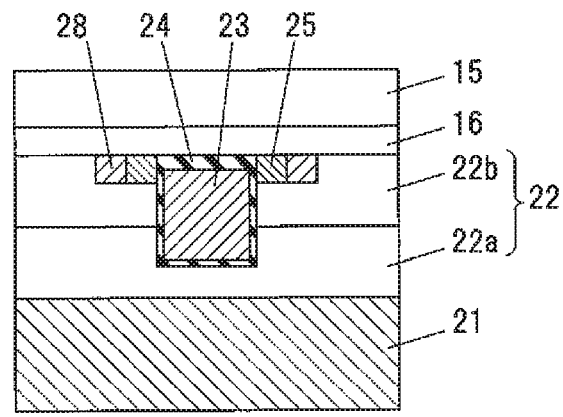
FIG. 8C is a vertical cross-sectional view showing the exemplary process of manufacturing the vertical transistor in the second embodiment.

Next, as shown in FIG. 8C, the epitaxial layer 22 is attached to the supporting substrate 15 via the adhesive layer 16. The material of the supporting substrate 15 used here is, e.g., metal, resin or ceramic, etc., but it is not limited thereto. The adhesive layer 16 is the same as that used in the first embodiment.

Figure 8D:
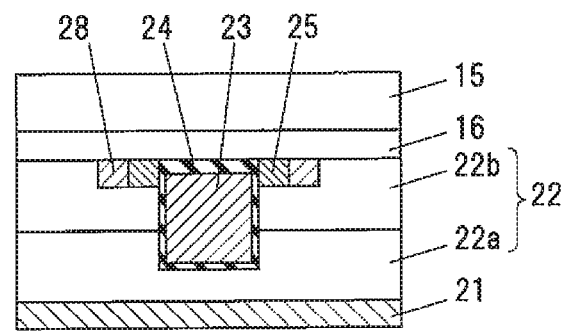
FIG. 8D is a vertical cross-sectional view showing the exemplary process of manufacturing the vertical transistor in the second embodiment.

Next, as shown in FIG. 8D, the thickness of the base substrate 21 supported by the supporting substrate 15 is reduced to not less than 10 μm and not more than 50 μm by polishing.

The polishing performed on the base substrate 21 is the same as the polishing performed on the base substrate 11 in the first embodiment.

Figure 9A:
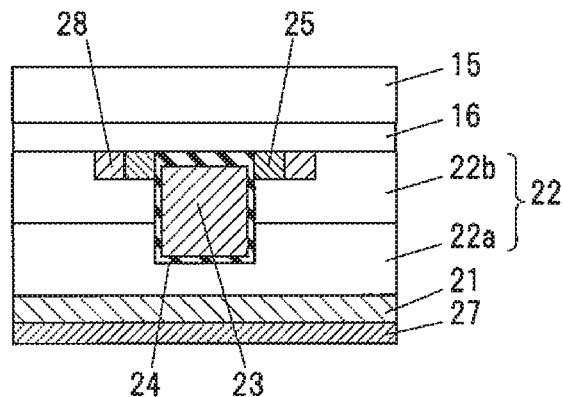
FIG. 9A is a vertical cross-sectional view showing the exemplary process of manufacturing the vertical transistor in the second embodiment.

Next, as shown in FIG. 9A, the drain electrode 27 is formed on the lower surface of the base substrate 21 (a surface opposite to the surface in contact with the epitaxial layer 22).

To form the drain electrode 27, for example, a mask pattern is formed on the base substrate 21 by photolithography, a metal film is then deposited on the whole surface of the base substrate 21, and the mask pattern and the metal film thereon are removed by lift-off.

Figure 9B:
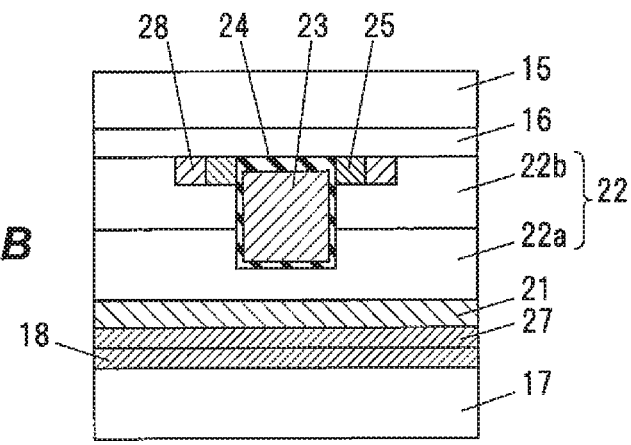
FIG. 9B is a vertical cross-sectional view showing the exemplary process of manufacturing the vertical transistor in the second embodiment.

Next, as shown in FIG. 9B, the supporting substrate 17 having the electrode 18 on one side is prepared, and the base substrate 21 is attached to the supporting substrate 17 by bonding the drain electrode 27 to the electrode 18. The material of the supporting substrate 17 is not specifically limited. However, the supporting substrate 17, when kept as a supporting substrate of the vertical transistor 20 as described later, is preferably formed of a material having a higher thermal conductivity than β-$Ga_2O_3$, e.g., a metal such as Al, a nitride such as AlN, SiN or GaN, an oxide such as $SiO_2$ or $Al_2O_3$, or, SiC, Si, GaAs or diamond, etc. The electrode 18 is the same as that used in the first embodiment.

Figure 9C:
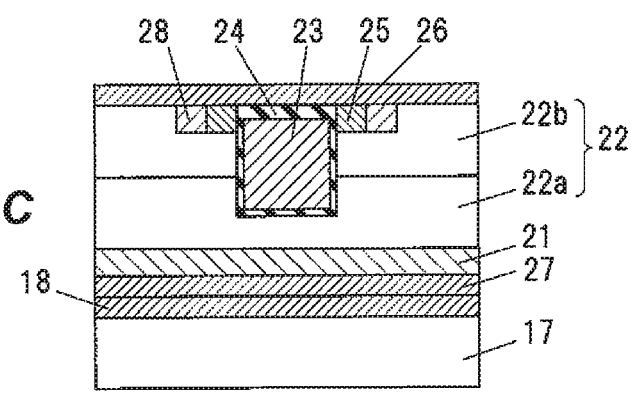
FIG. 9C is a vertical cross-sectional view showing the exemplary process of manufacturing the vertical transistor in the second embodiment.

Next, as shown in FIG. 9C, the epitaxial layer 22 supported by the supporting substrate 17 is separated from the supporting substrate 15 and the adhesive layer 16, and the source electrode 26 is then formed on the upper surface of the epitaxial layer 22 (a surface opposite to the surface in contact with the base substrate 21).

To form the source electrode 26, for example, a mask pattern is formed on the epitaxial layer 22 by photolithography, a metal film of Pt/Au, etc., is then deposited on the whole surface of the epitaxial layer 22, and the mask pattern and the metal film thereon are removed by lift-off.

In this manufacturing method, since the source electrode 26 is formed after polishing the base substrate 21, damage on the source electrode 26 during polishing of the base substrate 21 will never occur and it is thus possible to improve the yield of the vertical transistor 20.

The supporting substrate 17 may be kept as a supporting substrate of the finished vertical transistor 20. In this case, external power may be supplied to the drain electrode 27 through the electrode 18 of the supporting substrate 17. In case that the supporting substrate 17 is electrically conductive, external power may be supplied to the drain electrode 27 through the supporting substrate 17 and the electrode 18. Alternatively, the vertical transistor 20 may be separated from the supporting substrate 17 and then attached to another supporting substrate.

(Semiconductor Element Manufacturing Method 2)

Figure 10A:
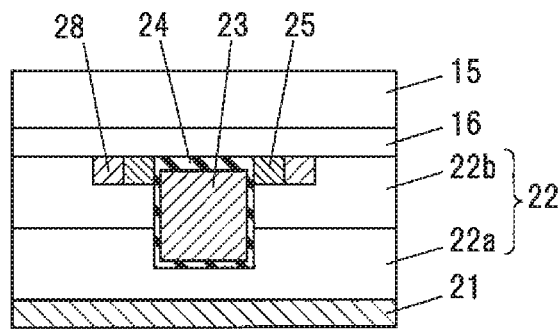
FIG. 10A is a vertical cross-sectional view showing an exemplary process of manufacturing the vertical transistor in the second embodiment.
Figure 10B:
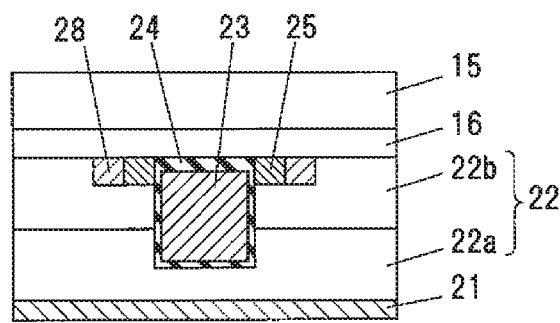
FIG. 10B is a vertical cross-sectional view showing the exemplary process of manufacturing the vertical transistor in the second embodiment.
Figure 10C:
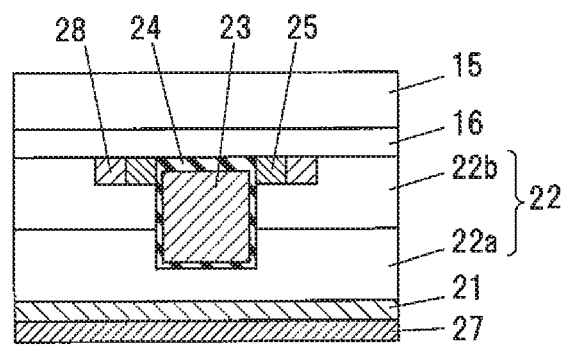
FIG. 10C is a vertical cross-sectional view showing the exemplary process of manufacturing the vertical transistor in the second embodiment.

FIGS. 10A to 10C are vertical cross-sectional views showing an exemplary process of manufacturing the vertical transistor 20 in the second embodiment. In the example shown in FIGS. 10A to 10C, the thickness of the base substrate 21 is reduced by polishing and subsequent etching.

Firstly, the process until polishing to reduce the thickness of the base substrate 21 shown in FIG. 8A to 8D is performed as shown in FIG. 10A.

Next, as shown in FIG. 10B, the thickness of the base substrate 21 supported by the supporting substrate 15 is further reduced by etching. The thickness of the base substrate 21 can be reduced to less than 10 μm by this etching.

The etching performed on the base substrate 21 is the same as the etching performed on the base substrate 11 in the first embodiment.

Next, as shown in FIG. 10C, the drain electrode 27 is formed on the lower surface of the base substrate 21.

After that, the base substrate 21 is attached to the supporting substrate 17, the epitaxial layer 22 is separated from the supporting substrate 15 and the adhesive layer 16, and the source electrode 26 is then formed, in the same manner as the process shown in FIGS. 9B and 9C.

(Semiconductor Element Manufacturing Method 3)

FIGS. 11A to 11D and 12 are vertical cross-sectional views showing an exemplary process of manufacturing the vertical transistor 20 in the second embodiment. In the example shown in FIGS. 11A to 11D and 12, the thickness of the base substrate 21 is reduced by polishing.

Figure 11A:
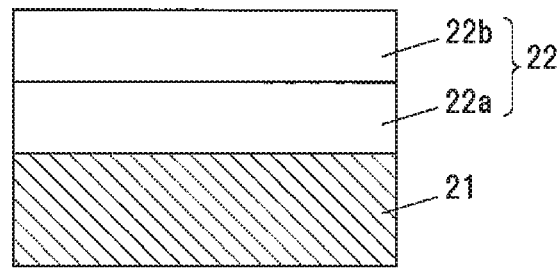
FIG. 11A is a vertical cross-sectional view showing an exemplary process of manufacturing the vertical transistor in the second embodiment.

Firstly, as shown in FIG. 11A, the epitaxial layer 22 is formed on the base substrate 21.

Figure 11B:
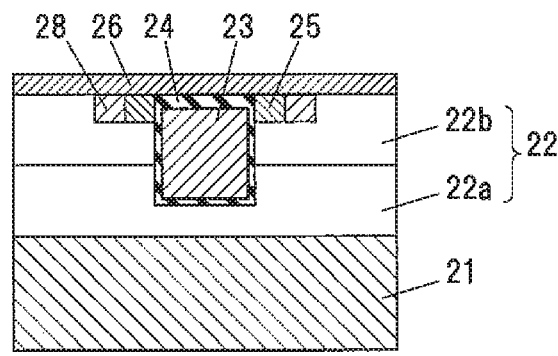
FIG. 11B is a vertical cross-sectional view showing the exemplary process of manufacturing the vertical transistor in the second embodiment.

Next, the gate electrode 23, the gate insulating film 24, the contact regions 25 and the $p^+$ regions 28 are formed in the epitaxial layer 22 and the source electrode 26 is then formed on the epitaxial layer 22, as shown in FIG. 11B.

Figure 11C:
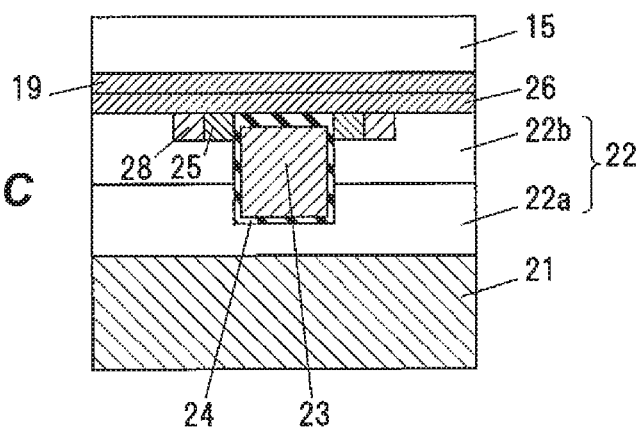
FIG. 11C is a vertical cross-sectional view showing the exemplary process of manufacturing the vertical transistor in the second embodiment.

Next, as shown in FIG. 11C, the supporting substrate 15 having the electrode 19 on one side is prepared, and the epitaxial layer 22 is attached to the supporting substrate 15 by bonding the source electrode 26 to the electrode 19. The material of the supporting substrate 15 is not specifically limited. However, the supporting substrate 15, when kept as a supporting substrate of the vertical transistor 20 as described later, is preferably formed of a material having a higher thermal conductivity than β-$Ga_2O_3$, e.g., a metal such as Al, a nitride such as AlN, SiN or GaN, an oxide such as $SiO_2$ or $Al_2O_3$, or, SiC, Si, GaAs or diamond, etc.

Figure 11D:
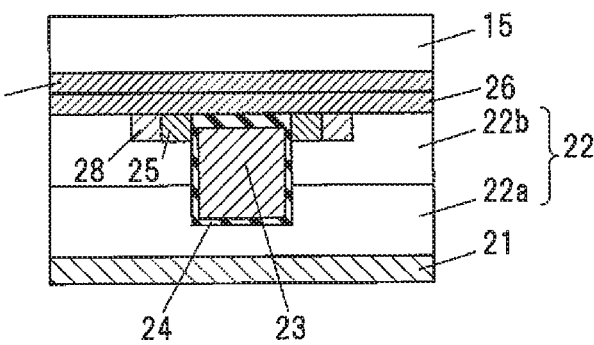
FIG. 11D is a vertical cross-sectional view showing the exemplary process of manufacturing the vertical transistor in the second embodiment.

Next, as shown in FIG. 11D, the thickness of the base substrate 21 supported by the supporting substrate 15 is reduced to not less than 10 μm and not more than 50 μm by polishing.

Figure 12:
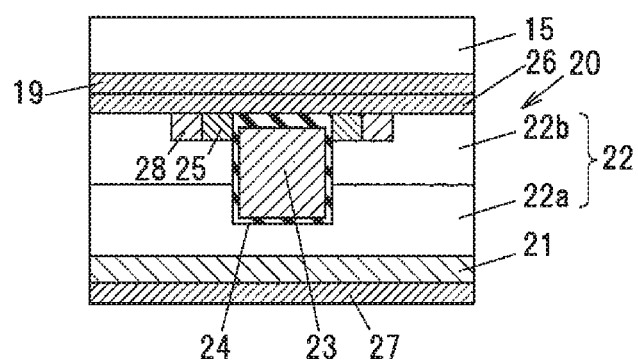
FIG. 12 is a vertical cross-sectional view showing the exemplary process of manufacturing the vertical transistor in the second embodiment.

Next, as shown in FIG. 12, the drain electrode 27 is formed on the lower surface of the base substrate 21 (a surface opposite to the surface in contact with the epitaxial layer 22).

The supporting substrate 15 may be kept as a supporting substrate of the finished vertical transistor 20. In this case, external power may be supplied to the source electrode 26 through the electrode 19 of the supporting substrate 15. In case that the supporting substrate 15 is electrically conductive, external power may be supplied to the source electrode 26 through the supporting substrate 15 and the electrode 19. Alternatively, the vertical transistor 20 may be separated from the supporting substrate 15 and then attached to another supporting substrate.

(Semiconductor Element Manufacturing Method 4)

Figure 13A:
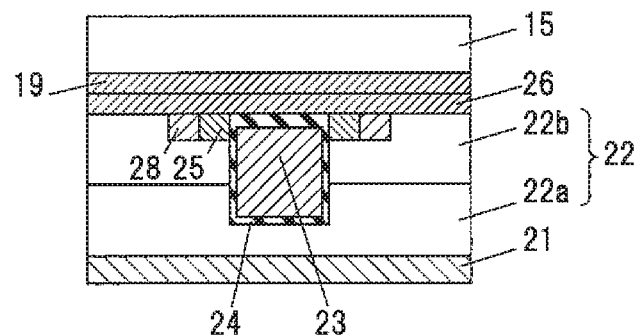
FIG. 13A is a vertical cross-sectional view showing an exemplary process of manufacturing the vertical transistor in the second embodiment.
Figure 13B:
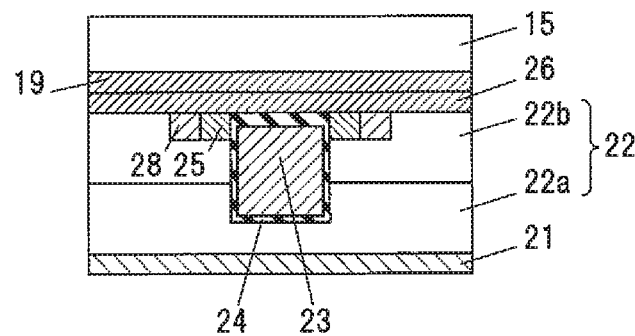
FIG. 13B is a vertical cross-sectional view showing the exemplary process of manufacturing the vertical transistor in the second embodiment.
Figure 13C:
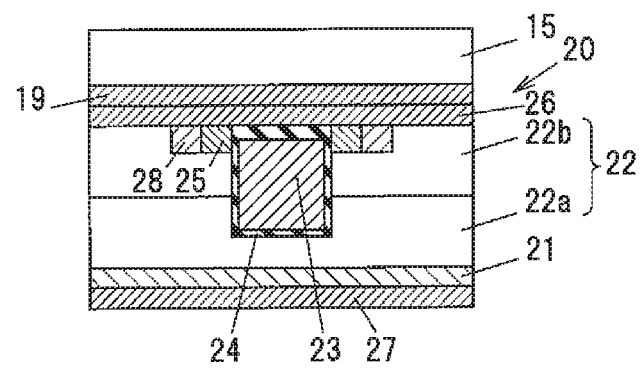
FIG. 13C is a vertical cross-sectional view showing the exemplary process of manufacturing the vertical transistor in the second embodiment.

FIGS. 13A to 13C are vertical cross-sectional views showing an exemplary process of manufacturing the vertical transistor 20 in the second embodiment. In the example shown in FIGS. 13A to 13C, the thickness of the base substrate 21 is reduced by polishing and subsequent etching.

Firstly, the process until polishing to reduce the thickness of the base substrate 21 shown in FIG. 11A to 11D is performed as shown in FIG. 13A.

Next, as shown in FIG. 13B, the thickness of the base substrate 21 supported by the supporting substrate 15 is further reduced by etching. The thickness of the base substrate 21 can be reduced to less than 10 µm by this etching.

Next, as shown in FIG. 13C, the drain electrode 27 is formed on the lower surface of the base substrate 21.

Third Embodiment

The third embodiment is a lateral semiconductor element, implemented as a lateral transistor having a MESFET (Metal Semiconductor Field Effect Transistor) structure.

(Structure of Semiconductor Element)

Figure 14:
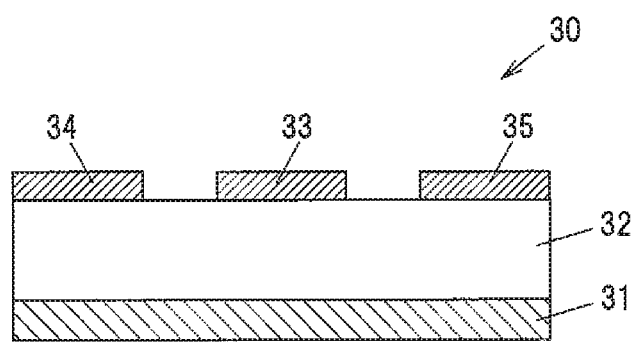
FIG. 14 is a vertical cross-sectional view showing a lateral transistor in a third embodiment.

FIG. 14 is a vertical cross-sectional view showing a lateral transistor 30 in the third embodiment. The lateral transistor 30 is provided with an epitaxial layer 32 formed on a base substrate 31, and a gate electrode 33, a source electrode 34 and a drain electrode 35 which are arranged on the epitaxial layer 32. The gate electrode 33 is arranged between the source electrode 34 and the drain electrode 35.

The gate electrode 33 is in contact with the upper surface of the epitaxial layer 32 (a surface opposite to the surface in contact with the base substrate 31) and a Schottky junction is formed therebetween. Meanwhile, the source electrode 34 and the drain electrode 35 are in contact with the upper surface of the epitaxial layer 32 and ohmic junctions are formed therebetween.

The base substrate 31 is formed of a $Ga_2O_3$-based crystal containing a p-type dopant such as Mg, Be, Zn or Fe and has high electrical resistance.

The thickness of the base substrate 31 is the same as the thickness of the base substrate 11 in the first embodiment. Since the base substrate 31 is thin, heat generated in the lateral transistor 30 can be efficiently released through the base substrate 31. The lateral transistor 30 thus has excellent heat dissipation property.

The plane orientation of the principal surface of the base substrate 31 is also the same as that of the base substrate 11 in the first embodiment, and (010) is especially preferable. Additionally, one or two buffer layers may be provided between the base substrate 31 and the epitaxial layer 32. The buffer layer has high resistance and can be regarded as part of the base substrate 31.

The epitaxial layer 32 is formed of a $Ga_2O_3$-based crystal and contains an n-type dopant. The n-type dopant concentration is higher in around contact portions with the source electrode 34 and the drain electrode 35 than in other portion. The thickness of the epitaxial layer 32 is, e.g., 0.1 to 1 µm.

Since the epitaxial layer 32 is formed of a $Ga_2O_3$-based crystal having high breakdown field strength, the lateral transistor 30 has excellent withstand voltage property. Thus, the lateral transistor 30 has both high heat dissipation property and high withstand voltage property.

The gate electrode 33, the source electrode 34 and the drain electrode 35 are formed of, e.g., a metal such as Au, Al, Ti, Sn, Ge, In, Ni, Co, Pt, W, Mo, Cr, Cu or Pb, an alloy containing two or more of such metals, a conductive compound such as ITO, or a conductive polymer. The conductive polymer to be used is, e.g., a polythiophene derivative (PEDOT: poly(3,4)-ethylenedioxythiophene) doped with polystyrene sulfonate (PSS) or a polypyrrole derivative doped with TCNA, etc. The gate electrode 33 may alternatively have a two-layer structure composed of two different metals, e.g., Al/Ti, Au/Ni or Au/Co.

In the lateral transistor 30, it is possible to change the thickness of a depletion layer formed under the gate electrode 33 in the epitaxial layer 32 by controlling bias voltage applied to the gate electrode 33, and thereby controlling a drain current.

A method for manufacturing the lateral transistor 30 in the third embodiment will be described below, along with specific examples. However, the method for manufacturing the lateral transistor 30 is not limited to the examples described below.

(Semiconductor Element Manufacturing Method 1)

FIGS. 15A to 15E are vertical cross-sectional views showing an exemplary process of manufacturing the lateral transistor 30 in the third embodiment. In the example shown in FIGS. 15A to 15E, the thickness of the base substrate 31 is reduced by polishing.

Figure 15A:
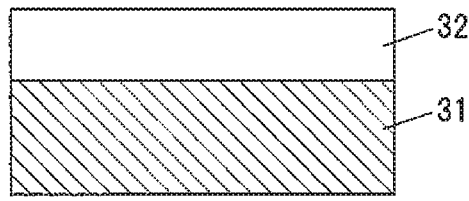
FIG. 15A is a vertical cross-sectional view showing an exemplary process of manufacturing the lateral transistor in the third embodiment.

Firstly, as shown in FIG. 15A, the epitaxial layer 32 is formed on the base substrate 31.

The base substrate 31 is the same substrate as the base substrate 11 in the first embodiment and has a thickness of, e.g., 600 µm before polishing. The process of forming the epitaxial layer 32 is the same as the process of forming the epitaxial layer 12 in the first embodiment.

Figure 15B:
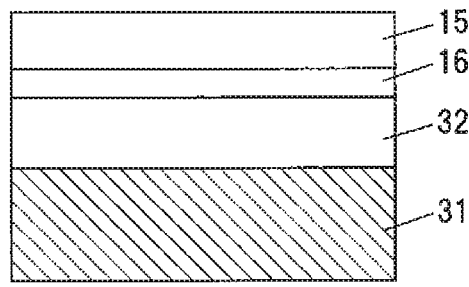
FIG. 15B is a vertical cross-sectional view showing the exemplary process of manufacturing the lateral transistor in the third embodiment.

Next, as shown in FIG. 15B, the epitaxial layer 32 is attached to the supporting substrate 15 via the adhesive layer 16. The material of the supporting substrate 15 used here is, e.g., metal, resin or ceramic, etc., but it is not limited thereto. The adhesive layer 16 is the same as that used in the first embodiment.

Figure 15C:
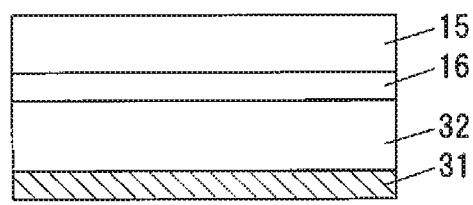
FIG. 15C is a vertical cross-sectional view showing the exemplary process of manufacturing the lateral transistor in the third embodiment.

Next, as shown in FIG. 15C, the thickness of the base substrate 31 supported by the supporting substrate 15 is reduced to not less than 10 µm and not more than 50 µm by polishing.

The polishing performed on the base substrate 31 is the same as the polishing performed on the base substrate 11 in the first embodiment.

Figure 15D:
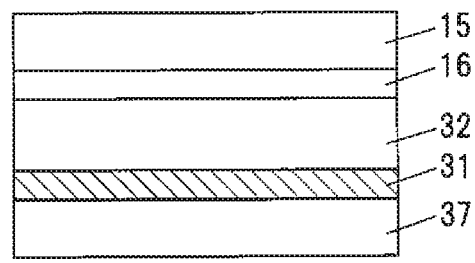
FIG. 15D is a vertical cross-sectional view showing the exemplary process of manufacturing the lateral transistor in the third embodiment.

Next, as shown in FIG. 15D, a supporting substrate 37 is attached to the lower surface of the base substrate 31 (a surface opposite to the surface in contact with the epitaxial layer 32). The material of the supporting substrate 37 is not specifically limited. However, the supporting substrate 37, when kept as a supporting substrate of the lateral transistor 30 as described later, is preferably formed of a material having a higher thermal conductivity than $\beta$-$Ga_2O_3$, e.g., a metal such as Al, a nitride such as AlN, SiN or GaN, an oxide such as $SiO_2$ or $Al_2O_3$, or, SiC, Si, GaAs or diamond, etc.

The base substrate 31 is attached to the supporting substrate 37 using solder (e.g., Au—Sn, Sn—Ag—Cu or Si—Ge), Ag paste, resin or inorganic material, etc.

Figure 15E:
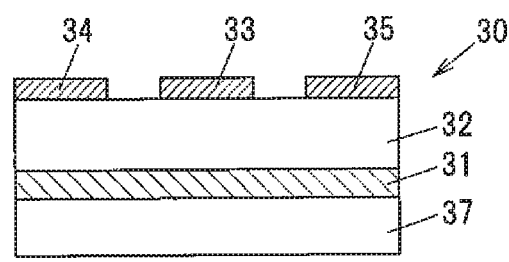
FIG. 15E is a vertical cross-sectional view showing the exemplary process of manufacturing the lateral transistor in the third embodiment.

Next, as shown in FIG. 15E, the epitaxial layer 32 supported by the supporting substrate 37 is separated from the supporting substrate 15 and the adhesive layer 16. Then, the gate electrode 33, the source electrode 34 and the drain electrode 35 are formed on the upper surface of the epitaxial layer 32 (a surface opposite to the surface in contact with the base substrate 31).

To form the gate electrode 33, the source electrode 34 and the drain electrode 35, for example, a mask pattern is formed on the epitaxial layer 32 by photolithography, a metal film is then deposited on the whole surface of the epitaxial layer 32, and the mask pattern and the metal film thereon are removed by lift-off.

In this manufacturing method, since the gate electrode 33, the source electrode 34 and the drain electrode 35 are formed after polishing the base substrate 31, damage on the gate electrode 33, the source electrode 34 and the drain electrode

35 during polishing of the base substrate 31 will never occur and it is thus possible to improve the yield of the lateral transistor 30.

The supporting substrate 37 may be kept as a supporting substrate of the finished lateral transistor 30. Alternatively, the lateral transistor 30 may be separated from the supporting substrate 37 and then attached to another supporting substrate.

(Semiconductor Element Manufacturing Method 2)

Figure 16A:
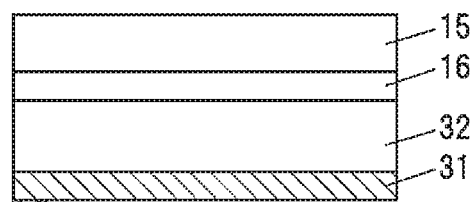
FIG. 16A is a vertical cross-sectional view showing an exemplary process of manufacturing the lateral transistor in the third embodiment.
Figure 16B:
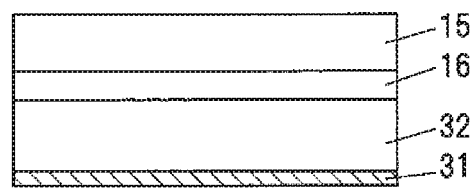
FIG. 16B is a vertical cross-sectional view showing the exemplary process of manufacturing the lateral transistor in the third embodiment.
Figure 16C:
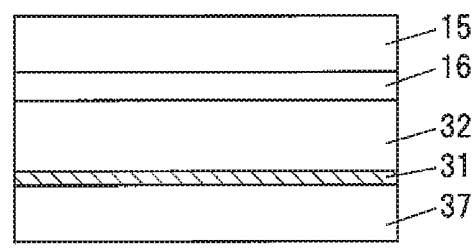
FIG. 16C is a vertical cross-sectional view showing the exemplary process of manufacturing the lateral transistor in the third embodiment.

FIGS. 16A to 16C are vertical cross-sectional views showing an exemplary process of manufacturing the lateral transistor 30 in the third embodiment. In the example shown in FIGS. 16A to 16C, the thickness of the base substrate 31 is reduced by polishing and subsequent etching.

Firstly, the process until polishing to reduce the thickness of the base substrate 31 shown in FIG. 15A to 15C is performed as shown in FIG. 16A.

Next, as shown in FIG. 16B, the thickness of the base substrate 31 supported by the supporting substrate 15 is further reduced by etching. The thickness of the base substrate 31 can be reduced to less than 10 μm by this etching.

The etching performed on the base substrate 31 is the same as the etching performed on the base substrate 11 in the first embodiment.

Next, as shown in FIG. 16C, the supporting substrate 37 is attached to the lower surface of the base substrate 31.

After that, the epitaxial layer 32 is separated from the supporting substrate 15 and the adhesive layer 16, and then, the gate electrode 33, the source electrode 34 and the drain electrode 35 are formed, in the same manner as the process shown in FIG. 15E.

(Semiconductor Element Manufacturing Method 3)

Figure 17A:
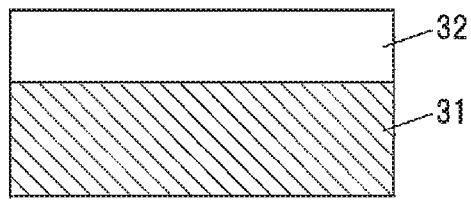
FIG. 17A is a vertical cross-sectional view showing an exemplary process of manufacturing the lateral transistor in the third embodiment.

FIGS. 17A to 17E are vertical cross-sectional views showing an exemplary process of manufacturing the lateral transistor 30 in the third embodiment. In the example shown in FIGS. 17A to 17E, the thickness of the base substrate 31 is reduced by polishing. Firstly, as shown in FIG. 17A, the epitaxial layer 32 is formed on the base substrate 31.

Figure 17B:
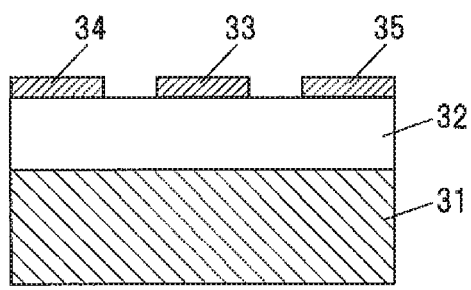
FIG. 17B is a vertical cross-sectional view showing the exemplary process of manufacturing the lateral transistor in the third embodiment.

Next, as shown in FIG. 17B, the gate electrode 33, the source electrode 34 and the drain electrode 35 are formed on the upper surface of the epitaxial layer 32.

Figure 17C:
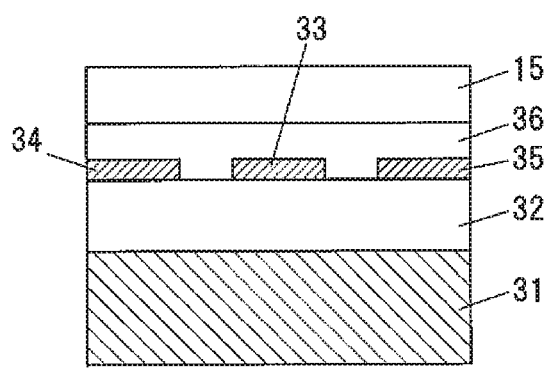
FIG. 17C is a vertical cross-sectional view showing the exemplary process of manufacturing the lateral transistor in the third embodiment.

Next, as shown in FIG. 17C, the supporting substrate 15 having an adhesive layer 36 of resin, etc., on one side is prepared, and the epitaxial layer 32 is attached to the supporting substrate 15 by bonding the adhesive layer 36 to the upper surface of the epitaxial layer 32 on which the gate electrode 33, the source electrode 34 and the drain electrode 35 are provided. The material of the supporting substrate 15 used here is, e.g., metal, resin or ceramic, etc., but it is not limited thereto.

Figure 17D:
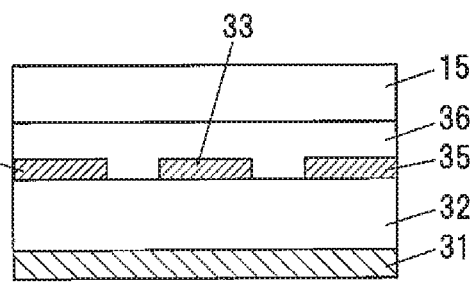
FIG. 17D is a vertical cross-sectional view showing the exemplary process of manufacturing the lateral transistor in the third embodiment.

Next, as shown in FIG. 17D, the thickness of the base substrate 31 supported by the supporting substrate 15 is reduced to not less than 10 μm and not more than 50 μm by polishing.

Figure 17E:
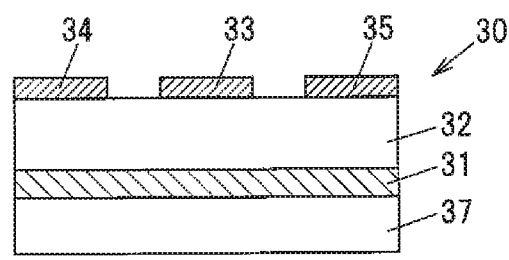
FIG. 17E is a vertical cross-sectional view showing the exemplary process of manufacturing the lateral transistor in the third embodiment.

Next, as shown in FIG. 17E, the supporting substrate 37 is attached to the lower surface of the base substrate 31, and the epitaxial layer 32 supported by the supporting substrate 37 is separated from the supporting substrate 15 and the adhesive layer 16. The material of the supporting substrate 37 is not specifically limited. However, the supporting substrate 37, when kept as a supporting substrate of the lateral transistor 30 as described later, is preferably formed of a material having a higher thermal conductivity than β-Ga$_2$O$_3$, e.g., a metal such as Al, a nitride such as AlN, SiN or GaN, an oxide such as SiO$_2$ or Al$_2$O$_3$, or, SiC, Si, GaAs or diamond, etc.

The supporting substrate 37 may be kept as a supporting substrate of the finished lateral transistor 30. Alternatively, the lateral transistor 30 may be separated from the supporting substrate 37 and then attached to another supporting substrate.

(Semiconductor Element Manufacturing Method 4)

Figure 18A:
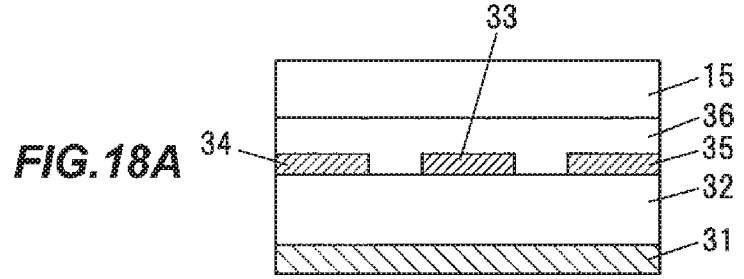
FIG. 18A is a vertical cross-sectional view showing an exemplary process of manufacturing the lateral transistor in the third embodiment.
Figure 18B:
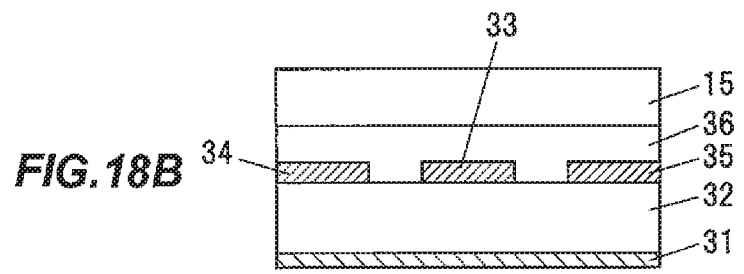
FIG. 18B is a vertical cross-sectional view showing the exemplary process of manufacturing the lateral transistor in the third embodiment.
Figure 18C:
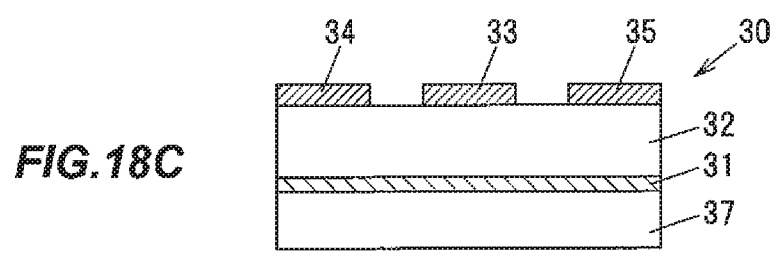
FIG. 18C is a vertical cross-sectional view showing the exemplary process of manufacturing the lateral transistor in the third embodiment.

FIGS. 18A to 18C are vertical cross-sectional views showing an exemplary process of manufacturing the lateral transistor 30 in the third embodiment. In the example shown in FIGS. 18A to 18C, the thickness of the base substrate 31 is reduced by polishing and subsequent etching.

Firstly, the process until polishing to reduce the thickness of the base substrate 31 shown in FIG. 17A to 17D is performed as shown in FIG. 18A.

Next, as shown in FIG. 18B, the thickness of the base substrate 31 supported by the supporting substrate 15 is further reduced by etching. The thickness of the base substrate 31 can be reduced to less than 10 μm by this etching.

Next, as shown in FIG. 18C, the supporting substrate 37 is attached to the lower surface of the base substrate 31, and the epitaxial layer 32 supported by the supporting substrate 37 is separated from the supporting substrate 15 and the adhesive layer 36.

(Semiconductor Element Manufacturing Method 5)

FIGS. 19A to 19D are vertical cross-sectional views showing an exemplary process of manufacturing the lateral transistor 30 in the third embodiment. In the example shown in FIGS. 19A to 19D, the thickness of the base substrate 31 is reduced by polishing.

Figure 19A:
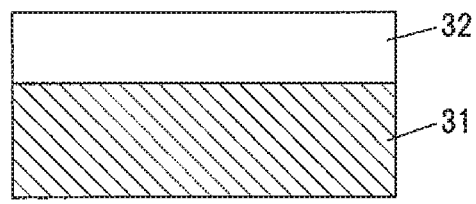
FIG. 19A is a vertical cross-sectional view showing an exemplary process of manufacturing the lateral transistor in the third embodiment.

Firstly, as shown in FIG. 19A, the epitaxial layer 32 is formed on the base substrate 31.

Figure 19B:
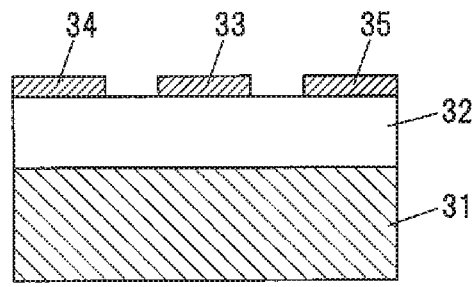
FIG. 19B is a vertical cross-sectional view showing the exemplary process of manufacturing the lateral transistor in the third embodiment.

Next, as shown in FIG. 19B, the gate electrode 33, the source electrode 34 and the drain electrode 35 are formed on the upper surface of the epitaxial layer 32.

Figure 19C:
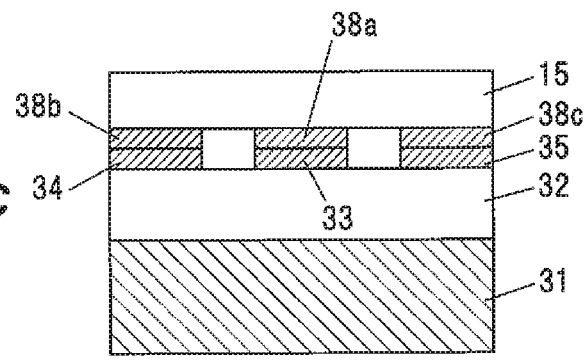
FIG. 19C is a vertical cross-sectional view showing the exemplary process of manufacturing the lateral transistor in the third embodiment.

Next, as shown in FIG. 19C, the supporting substrate 15 having electrodes 38a, 38b and 38c on one side is prepared, and the epitaxial layer 32 is attached to the supporting substrate 15 by bonding the gate electrode 33, the source electrode 34 and the drain electrode 35 respectively to the electrodes 38a, 38b and 38c. The material of the supporting substrate 15 is not specifically limited. However, the supporting substrate 15, when kept as a supporting substrate of the lateral transistor 30 as described later, is preferably formed of a material having a higher thermal conductivity than β-Ga$_2$O$_3$, e.g., a metal such as Al, a nitride such as AlN, SiN or GaN, an oxide such as SiO$_2$ or Al$_2$O$_3$, or, SiC, Si, GaAs or diamond, etc.

Figure 19D:
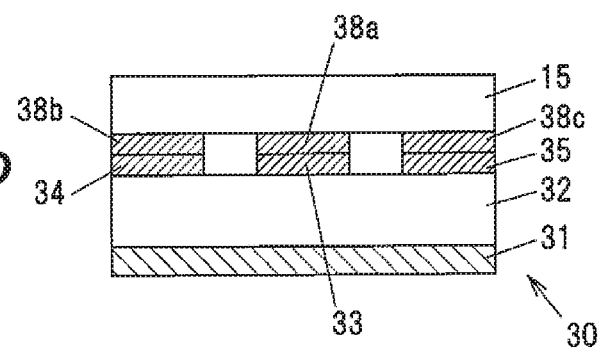
FIG. 19D is a vertical cross-sectional view showing the exemplary process of manufacturing the lateral transistor in the third embodiment.

Next, as shown in FIG. 19D, the thickness of the base substrate 31 supported by the supporting substrate 15 is reduced to not less than 10 μm and not more than 50 μm by polishing.

The supporting substrate 15 may be kept as a supporting substrate of the finished lateral transistor 30. In this case, however, the supporting substrate 15 needs to have insulation properties. Also, in this case, external power may be supplied to the gate electrode 33, the source electrode 34 and the drain electrode 35 through the electrodes 38a, 38b and 38c of the supporting substrate 15. Alternatively, the lateral transistor 30 may be separated from the supporting substrate 15 and then attached to another supporting substrate.

(Semiconductor Element Manufacturing Method 6)

Figure 20A:
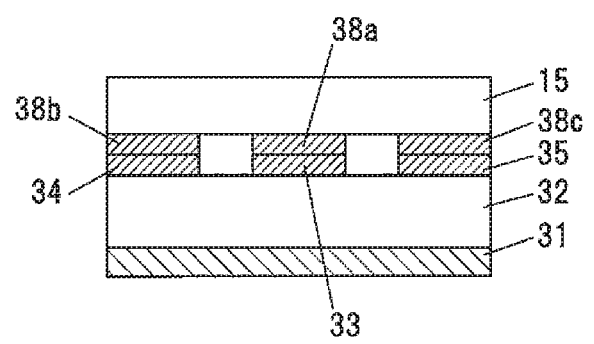
FIG. 20A is a vertical cross-sectional view showing an exemplary process of manufacturing the lateral transistor in the third embodiment.
Figure 20B:
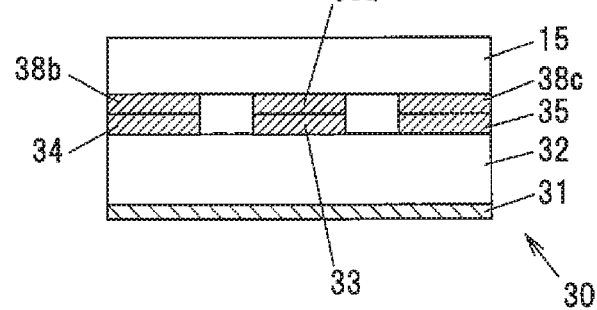
FIG. 20B is a vertical cross-sectional view showing the exemplary process of manufacturing the lateral transistor in the third embodiment.

FIGS. 20A and 20B are vertical cross-sectional views showing an exemplary process of manufacturing the lateral transistor 30 in the third embodiment. In the example shown in FIGS. 20A and 20B, the thickness of the base substrate 31 is reduced by polishing and subsequent etching.

Firstly, the process until polishing to reduce the thickness of the base substrate 31 shown in FIG. 19A to 19D is performed as shown in FIG. 20A.

Next, as shown in FIG. 20B, the thickness of the base substrate 31 supported by the supporting substrate 15 is further reduced by etching. The thickness of the base substrate 31 can be reduced to less than 10 μm by this etching.

(Modification)

The lateral transistor 30 may be a MISFET in which the gate electrode 33 is formed on the epitaxial layer 32 via a gate insulating film.

The gate insulating film in this case is formed of an insulating material such as $SiO_2$, AlN, SiN, $Al_2O_3$ or $\beta\text{-}(Al_xGa_{1-x})_2O_3$ (0≤x≤1). Of those, the $\beta\text{-}(Al_xGa_{1-x})_2O_3$ can be grown as a single crystal film on a $\beta\text{-}Ga_2O_3$ crystal and allows a good semiconductor-insulating film interface with less interface states to be formed, resulting in that better gate characteristics than when using other insulating films are obtained.

In this case, the epitaxial layer 32 may be an undoped layer not containing a dopant, or a p-type layer containing a p-type dopant such as Be, Mg or Zn.

When the lateral transistor 30 is a MISFET, each MESFET manufacturing process described above is performed with addition of a process of forming a gate insulating film. The gate insulating film is formed by, e.g., deposition and etching.

Fourth Embodiment

The fourth embodiment is a vertical semiconductor element, implemented as a Schottky diode.

(Structure of Semiconductor Element)

Figure 21:
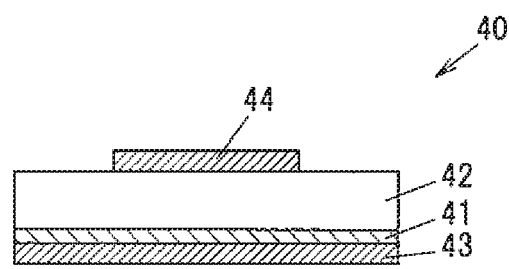
FIG. 21 is a vertical cross-sectional view showing a Schottky diode in a fourth embodiment.

FIG. 21 is a vertical cross-sectional view showing a Schottky diode 40 in the fourth embodiment. The Schottky diode 40 is provided with an epitaxial layer 42, an ion implanted layer 41 formed on one surface of the epitaxial layer 42, a cathode electrode 43 formed on a lower surface of the epitaxial layer 42 (a surface on which the ion implanted layer 41 is provided) and in ohmic contact with the epitaxial layer 42, and an anode electrode 44 formed on an upper surface of the epitaxial layer 42 (a surface on which the ion implanted layer 41 is not provided) and in Schottky contact with the epitaxial layer 42.

In the Schottky diode 40, a Schottky barrier height at an interface between the anode electrode 44 and the epitaxial layer 42 is lowered by applying forward bias between the anode electrode 44 and the cathode electrode 43 and a current flows from the anode electrode 44 to the cathode electrode 43, in the same manner as the Schottky diode 10 in the first embodiment. On the other hand, when reverse bias is applied between the anode electrode 44 and the cathode electrode 43, the Schottky barrier height at the interface between the anode electrode 44 and the epitaxial layer 42 is increased and the current does not flow.

The epitaxial layer 42 is formed of a $Ga_2O_3$-based crystal and contains an n-type dopant, in the same manner as the epitaxial layer 12 in the first embodiment.

The ion implanted layer 41 is a layer formed by implanting a high dose of n-type dopant into the epitaxial layer 42, and has a higher n-type dopant concentration than the epitaxial layer 42. In addition, the ion implanted layer 41 is formed in the epitaxial layer 42 near the surface and is obviously thinner than the epitaxial layer 42. The n-type dopant is preferably a Group IV element such as Si or Sn. To reduce the conduction loss of Schottky diode, it is particularly preferable to use Si as an n-type dopant since an activation rate of Si when implanted at a high dose is higher than Sn.

In the Schottky diode 40, a base substrate used as a base for epitaxial growth of the epitaxial layer 42, e.g., a base substrate 45 described later, is removed and the ion implanted layer 41 is used as a layer to be in ohmic contact with the cathode electrode 43. Therefore, a heat dissipation path to the ion implanted layer 41 does not pass through the base substrate and heat is efficiently dissipated. The Schottky diode 40 thus has excellent heat dissipation property. Furthermore, use of the ion implantation technique can achieve a higher donor concentration than when using a method in which an impurity is added during growth of the substrate, resulting in reduction in the conduction loss of Schottky diode.

The thickness of the epitaxial layer 42 is, e.g., 0.4 to 30 μm. Meanwhile, the thickness of the ion implanted layer 41 is preferably not less than 0.05 μm so that the ion implanted layer 41 is in ohmic contact with the cathode electrode 43.

Since the epitaxial layer 42 is formed of a $Ga_2O_3$-based crystal having a high breakdown field strength, a decrease in withstand voltage property of the Schottky diode 40 can be suppressed even though the base substrate 45 is removed. Thus, the Schottky diode 40 has both high heat dissipation property and high withstand voltage property.

The materials of the anode electrode 44 and the cathode electrode 43 are respectively the same as those for the anode electrode 14 and the cathode electrode 13 in the first embodiment.

(Semiconductor Element Manufacturing Method)

FIGS. 22A to 22E and 23A to 23D are vertical cross-sectional views showing an exemplary process of manufacturing the Schottky diode 40 in the fourth embodiment. In the example shown in FIGS. 22A to 22E and 23A to 23D, the base substrate is removed by polishing, etc.

Figure 22A:
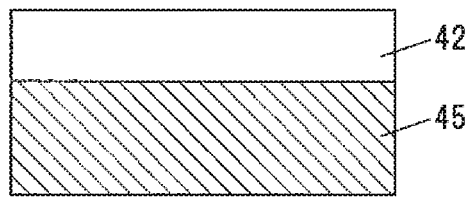
FIG. 22A is a vertical cross-sectional view showing an exemplary process of manufacturing the Schottky diode in the fourth embodiment.

Firstly, as shown in FIG. 22A, the epitaxial layer 42 is formed on the base substrate 45.

The base substrate 45 is the same substrate as the base substrate 11 in the first embodiment and has a thickness of, e.g., 600 μm before polishing, etc. The base substrate 45 may not contain an n-type dopant. The process of forming the epitaxial layer 42 is the same as the process of forming the epitaxial layer 12 in the first embodiment.

Figure 22B:
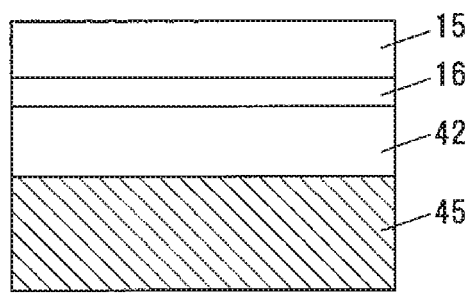
FIG. 22B is a vertical cross-sectional view showing the exemplary process of manufacturing the Schottky diode in the fourth embodiment.

Next, as shown in FIG. 22B, the epitaxial layer 42 is attached to the supporting substrate 15 via the adhesive layer 16. The material of the supporting substrate 15 used here is, e.g., metal, resin or ceramic, etc., but it is not limited thereto. The adhesive layer 16 is the same as that used in the first embodiment.

Figure 22C:
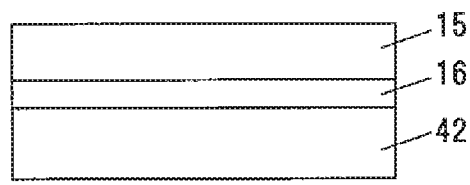
FIG. 22C is a vertical cross-sectional view showing the exemplary process of manufacturing the Schottky diode in the fourth embodiment.

Next, as shown in FIG. 22C, the base substrate 45 supported by the supporting substrate 15 is reduced in thickness by polishing, and is eventually removed by further continuous polishing.

The method of removing the base substrate 45 is not limited to polishing, and may be a combination of polishing with another process such as etching.

Figure 22D:
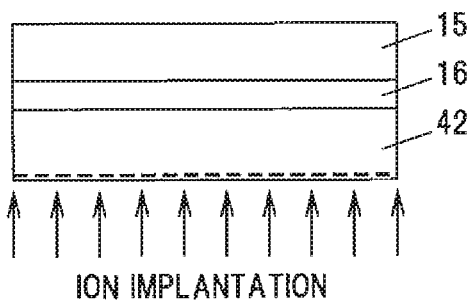
FIG. 22D is a vertical cross-sectional view showing the exemplary process of manufacturing the Schottky diode in the fourth embodiment.

Next, as shown in FIG. 22D, ions of an n-type dopant are implanted into the lower surface of the epitaxial layer 42.

Figure 22E:
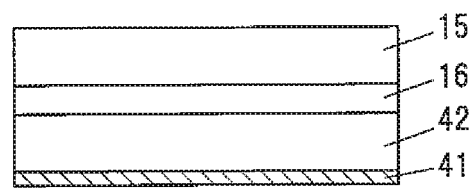
FIG. 22E is a vertical cross-sectional view showing the exemplary process of manufacturing the Schottky diode in the fourth embodiment.

Next, as shown in FIG. 22E, the n-type dopant implanted in the epitaxial layer 42 is activated by annealing and the ion implanted layer 41 is thereby formed. The annealing is performed, e.g., in an inert atmosphere at 800 to 1000° C. for 30 minutes.

Figure 23A:
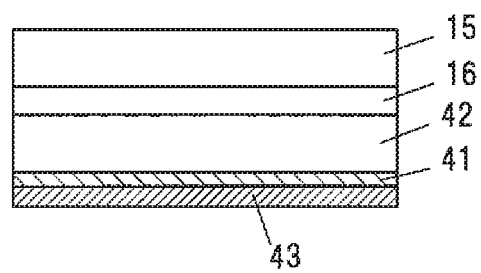
FIG. 23A is a vertical cross-sectional view showing the exemplary process of manufacturing the Schottky diode in the fourth embodiment.

Next, as shown in FIG. 23A, the cathode electrode 43 is formed on the lower surface of the epitaxial layer 42 so as to be in contact with the ion implanted layer 41. Since the ion implanted layer 41 contains a high concentration of n-type dopant, the ion implanted layer 41 is in ohmic contact with the cathode electrode 43. The process of forming the cathode electrode 43 is the same as the process of forming the cathode electrode 13 in the first embodiment.

Figure 23B:
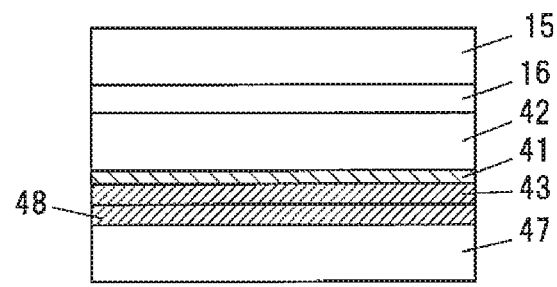
FIG. 23B is a vertical cross-sectional view showing the exemplary process of manufacturing the Schottky diode in the fourth embodiment.

Next, as shown in FIG. 23B, a supporting substrate 47 having an electrode 48 on one side is prepared, and the epitaxial layer 42 is attached to the supporting substrate 47 by bonding the cathode electrode 43 to the electrode 48.

The material of the supporting substrate 47 is not specifically limited. However, the supporting substrate 47, when kept as a supporting substrate of the Schottky diode 40 as described later, is preferably formed of a material having a higher thermal conductivity than $\beta$-$Ga_2O_3$, e.g., a metal such as Al, a nitride such as AlN, SiN or GaN, an oxide such as $SiO_2$ or A1203, or, SiC, Si, GaAs or diamond, etc. The electrode 48 is formed of, e.g., Au. The cathode electrode 43 is bonded to the electrode 48 by applying, e.g., pressure, heat, the combination of pressure with ultrasonic vibration, or, pressure and the combination of pressure with ultrasonic vibration.

Figure 23C:
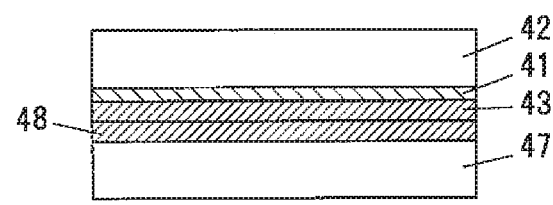
FIG. 23C is a vertical cross-sectional view showing the exemplary process of manufacturing the Schottky diode in the fourth embodiment.

Next, as shown in FIG. 23C, the epitaxial layer 42 supported by the supporting substrate 47 is separated from the supporting substrate 15 and the adhesive layer 16.

Figure 23D:
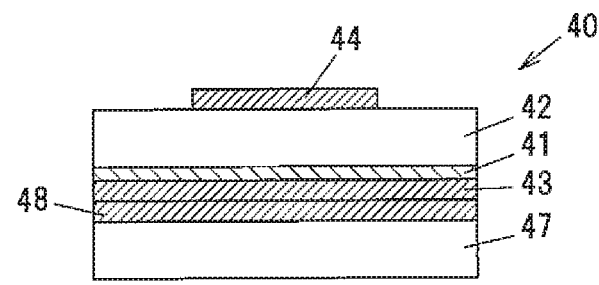
FIG. 23D is a vertical cross-sectional view showing the exemplary process of manufacturing the Schottky diode in the fourth embodiment.

Next, as shown in FIG. 23D, the anode electrode 44 is formed on the upper surface of the epitaxial layer 42. Since the region of the epitaxial layer 42 other than the ion implanted layer 41 contains a low concentration of n-type dopant, the epitaxial layer 42 is in Schottky contact with the anode electrode 44. The process of forming the anode electrode 44 is the same as the process of forming the anode electrode 14 in the first embodiment.

The supporting substrate 47 may be kept as a supporting substrate of the finished Schottky diode 40. In this case, external power may be supplied to the cathode electrode 43 through the electrode 48 of the supporting substrate 47. In case that the supporting substrate 47 is electrically conductive, external power may be supplied to the cathode electrode 43 through the supporting substrate 47 and the electrode 48. Alternatively, the Schottky diode 40 may be separated from the supporting substrate 47 and then attached to another supporting substrate.

Fifth Embodiment

In the fifth embodiment, supporting substrates are attached to both surfaces of a Schottky diode, a vertical transistor and a lateral transistor as semiconductor elements to improve heat dissipation.

(Structure of Semiconductor Element)

Figure 24A:
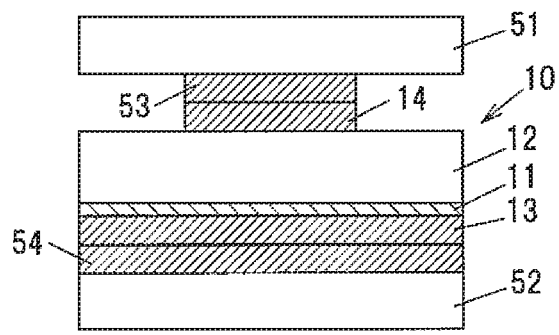
FIG. 24A is a vertical cross-sectional view showing the Schottky diode with supporting substrates attached on both sides.

FIG. 24A is a vertical cross-sectional view showing the Schottky diode 10 in the first embodiment with supporting substrates attached on both sides.

A supporting substrate 51 has an electrode 53 on one side, and the epitaxial layer 12 is attached to the supporting substrate 51 by bonding the anode electrode 14 to the electrode 53. A supporting substrate 52 has an electrode 54 on one side, and the base substrate 11 is attached to the supporting substrate 52 by bonding the cathode electrode 13 to the electrode 54.

The material of the supporting substrates 51 and 52 is preferably a material having a higher thermal conductivity than $\beta$-$Ga_2O_3$, e.g., a metal such as Al, a nitride such as AlN, SiN or GaN, an oxide such as $SiO_2$ or $Al_2O_3$, or, SiC, Si, GaAs or diamond, etc.

The same configuration can be adapted also when the Schottky diode 40 in the fourth embodiment is used in place of the Schottky diode 10. In this case, the epitaxial layer 42 and the ion implanted layer 41 of the Schottky diode 40 are respectively attached to the supporting substrates 51 and 52.

Figure 24B:
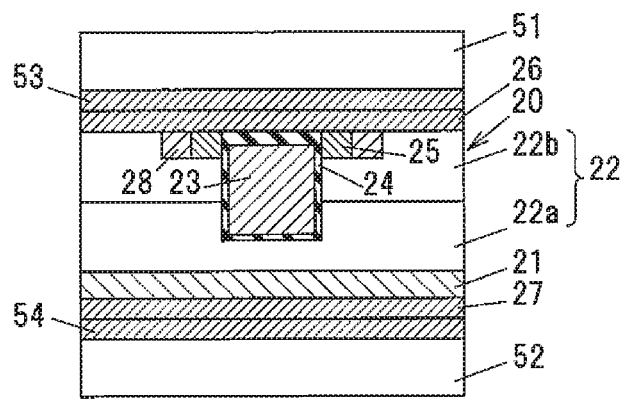
FIG. 24B is a vertical cross-sectional view showing the vertical transistor with supporting substrates attached on both sides.

FIG. 24B is a vertical cross-sectional view showing the vertical transistor 20 in the second embodiment with supporting substrates attached on both sides.

The epitaxial layer 22 is attached to the supporting substrate 51 by bonding the source electrode 26 to the electrode 53. The base substrate 21 is attached to the supporting substrate 52 by bonding the drain electrode 27 to the electrode 54.

External power may be supplied to the Schottky diode 10 and the vertical transistor 20 in the fifth embodiment through the electrodes 53 and 54. In case that the supporting substrates 51 and 52 are electrically conductive, external power may be supplied through the supporting substrates 51 and 52 and the electrodes 53 and 54.

Figure 24C:
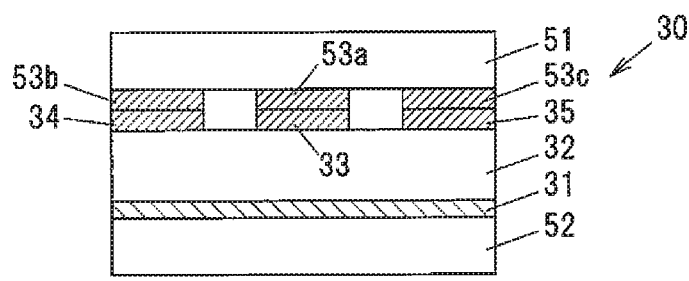
FIG. 24C is a vertical cross-sectional view showing the lateral transistor with supporting substrates attached on both sides.

FIG. 24C is a vertical cross-sectional view showing the lateral transistor 30 in the third embodiment with supporting substrates attached on both sides.

The supporting substrate 51 has electrodes 53$a$, 53$b$ and 53$c$ on one side, and the epitaxial layer 32 is attached to the supporting substrate 51 by bonding source electrode 53$a$, the drain electrode 53$b$ and the adhesive layer 53$c$ to the electrodes 53$a$, 53$b$ and 53$c$. Meanwhile, the base substrate 31 is attached to the supporting substrate 52.

The supporting substrates attached on both sides of the semiconductor element as described above allow heat to be efficiently dissipated through the both surfaces and this improves heat dissipation efficiency of the semiconductor element.

Sixth Embodiment

The sixth embodiment is a vertical semiconductor element, implemented as a Schottky diode.

(Structure of Semiconductor Element)

Figure 25:
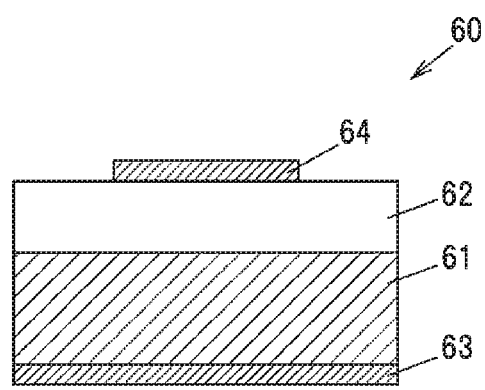
FIG. 25 is a vertical cross-sectional view showing a Schottky diode in a sixth embodiment.

FIG. 25 is a vertical cross-sectional view showing a Schottky diode 60 in the sixth embodiment. The Schottky diode 60 is provided with an epitaxial layer 62, a highly thermal conductive substrate 61 bonded to one surface of the epitaxial layer 62, a cathode electrode 63 formed on a lower surface of the highly thermal conductive substrate 61 (a surface opposite to the surface in contact with the epitaxial layer 62) and in ohmic contact with the highly thermal conductive substrate 61, and an anode electrode 64 formed on an upper surface of the epitaxial layer 62 (a surface opposite to the surface in contact with the highly thermal conductive substrate 61) and in Schottky contact with the epitaxial layer 62.

In the Schottky diode 60, a Schottky barrier height at an interface between the anode electrode 64 and the epitaxial layer 62 is lowered by applying forward bias between the anode electrode 64 and the cathode electrode 63 and a current flows from the anode electrode 64 to the cathode electrode 63, in the same manner as the Schottky diode 10 in the first embodiment. On the other hand, when reverse bias is applied between the anode electrode 64 and the cathode electrode 63, the Schottky barrier height at the interface between the anode electrode 64 and the epitaxial layer 62 is increased and the current does not flow.

The epitaxial layer 62 is formed of a $Ga_2O_3$-based crystal and contains an n-type dopant, in the same manner as the epitaxial layer 12 in the first embodiment.

The highly thermal conductive substrate 61 is formed of a material having a higher thermal conductivity than $Ga_2O_3$-based crystal, such as MN or Si, and contains an n-type dopant. The n-type dopant concentration of the highly thermal conductive substrate 61 is higher than that of the epitaxial layer 62.

In the Schottky diode 60, a base substrate used as a base for epitaxial growth of the epitaxial layer 62, e.g., a base substrate 65 described later, is removed and the highly thermal conductive substrate 61 is used as a layer to be in ohmic contact with the cathode electrode 63. Since the thermal conductivity of the highly thermal conductive substrate 61 is higher than that of the base substrate 65 formed of a $Ga_2O_3$-based crystal, heat dissipation can be improved by using the highly thermal conductive substrate 61 as a layer to be in ohmic contact with the cathode electrode 63. The Schottky diode 60 thus has excellent heat dissipation property.

In addition, since the highly thermal conductive substrate 61 has a high thermal conductivity, thickness reduction of the Schottky diode 60 to improve heat dissipation is not necessary.

The thickness of the epitaxial layer 62 is, e.g., 0.4 to 30 μm. Meanwhile, the thickness of the highly thermal conductive substrate 61 is preferably not less than 0.05 μm so that the highly thermal conductive substrate 61 is in ohmic contact with the cathode electrode 63.

The materials of the anode electrode 64 and the cathode electrode 63 are respectively the same as those for the anode electrode 14 and the cathode electrode 13 in the first embodiment.

A method for manufacturing the Schottky diode 60 in the sixth embodiment will be described below, along with specific example. However, the method for manufacturing the Schottky diode 60 is not limited to the example described below.

(Semiconductor Element Manufacturing Method)

FIGS. 26A to 26E are vertical cross-sectional views showing an exemplary process of manufacturing the Schottky diode 60 in the sixth embodiment. In the example shown in FIGS. 26A to 26E, the base substrate is removed by polishing.

Figure 26A:
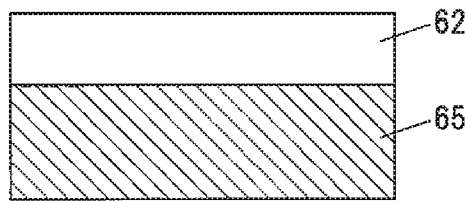
FIG. 26A is a vertical cross-sectional view showing an exemplary process of manufacturing the Schottky diode in the sixth embodiment.

Firstly, as shown in FIG. 26A, the epitaxial layer 62 is formed on the base substrate 65.

The base substrate 65 is the same substrate as the base substrate 11 in the first embodiment and has a thickness of, e.g., 600 μm before polishing, etc. The base substrate 65 may not contain an n-type dopant. The process of forming the epitaxial layer 62 is the same as the process of forming the epitaxial layer 12 in the first embodiment.

Figure 26B:
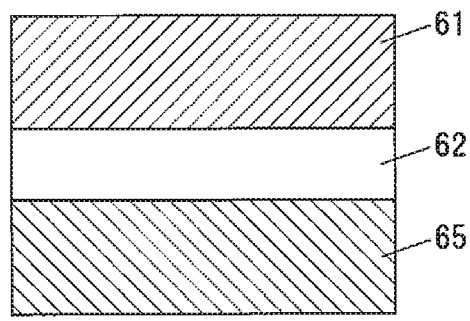
FIG. 26B is a vertical cross-sectional view showing the exemplary process of manufacturing the Schottky diode in the sixth embodiment.

Next, as shown in FIG. 26B, the highly thermal conductive substrate 61 is bonded to the upper surface of the epitaxial layer 62. For example, direct bonding such as surface activated bonding is used to bond the highly thermal conductive substrate 61 to the epitaxial layer 62. In case of using surface activated bonding, respective joint surfaces of the epitaxial layer 62 and the highly thermal conductive substrate 61 are, e.g., etched with Ar plasma to remove surface layers for activation, and the activated surfaces are then bonded to each other. Heat or pressure may be additionally applied even though high strength bonding can be obtained at room temperature in this method. The epitaxial layer 62 and the highly thermal conductive substrate 61, which are bonded by surface activated bonding, are in ohmic contact with each other at a bonding interface therebetween.

Figure 26C:
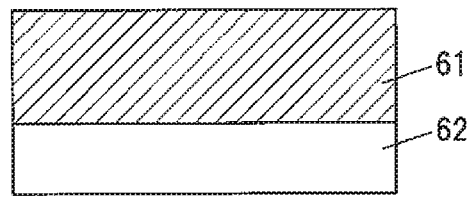
FIG. 26C is a vertical cross-sectional view showing the exemplary process of manufacturing the Schottky diode in the sixth embodiment.

Next, as shown in FIG. 26C, the base substrate 65 supported by the highly thermal conductive substrate 61 is reduced in thickness by polishing, and is eventually removed by further continuous polishing.

The method of removing the base substrate 65 is not limited to polishing, and may be a combination of polishing with another process such as etching.

Figure 26D:
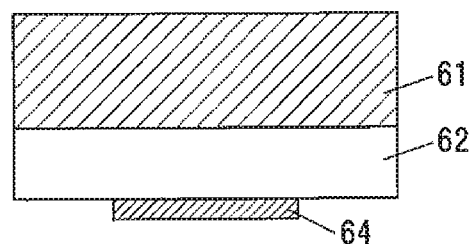
FIG. 26D is a vertical cross-sectional view showing the exemplary process of manufacturing the Schottky diode in the sixth embodiment.

Next, as shown in FIG. 26D, the anode electrode 64 is formed on a surface of the epitaxial layer 62 on the opposite side to the highly thermal conductive substrate 61. Since the epitaxial layer 62 contains a low concentration of n-type dopant, the epitaxial layer 62 is in Schottky contact with the anode electrode 64. The process of forming the anode electrode 64 is the same as the process of forming the anode electrode 14 in the first embodiment.

Figure 26E:
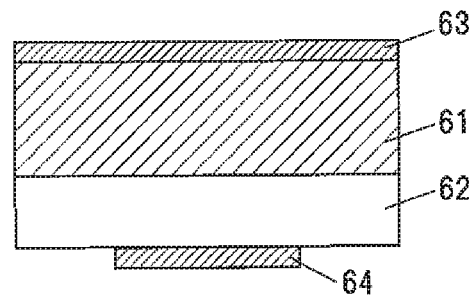
FIG. 26E is a vertical cross-sectional view showing the exemplary process of manufacturing the Schottky diode in the sixth embodiment.

Next, as shown in FIG. 26E, the cathode electrode 63 is formed on a surface of the highly thermal conductive substrate 61 on the opposite side to the epitaxial layer 62. Since the highly thermal conductive substrate 61 contains a high concentration of n-type dopant, the highly thermal conductive substrate 61 is in ohmic contact with the cathode electrode 63.

The process of forming the cathode electrode 63 is the same as the process of forming the cathode electrode 63 in the first embodiment.

Seventh Embodiment

The seventh embodiment is a vertical semiconductor element, implemented as a vertical transistor having a MISFET structure.

(Structure of Semiconductor Element)

Figure 27:
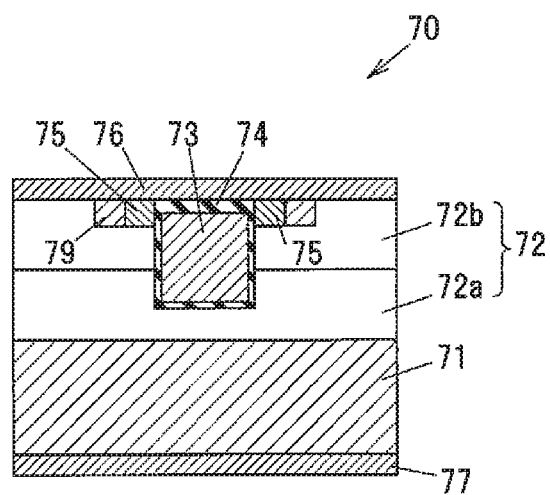
FIG. 27 is a vertical cross-sectional view showing a vertical transistor in a seventh embodiment.

FIG. 27 is a vertical cross-sectional view showing a vertical transistor 70 in the seventh embodiment. The vertical transistor 70 is provided with an epitaxial layer 72, a highly thermal conductive substrate 71 bonded to one surface of the epitaxial layer 72, a gate electrode 73 covered with a gate insulating film 74 and embedded in the epitaxial layer 72, contact regions 75 formed in the epitaxial layer 72 so as to be located on both sides of the gate electrode 73, $p^+$ regions 79 formed on respective sides of the contact regions 75, a source electrode 76 formed on the epitaxial layer 72 and connected to the contact regions 75, and a drain electrode 77 formed on a surface of the highly thermal conductive substrate 71 on the opposite side to the epitaxial layer 72.

The vertical transistor 70 is a vertical semiconductor element in which the source electrode 76 and the drain electrode 77 are arranged respectively on and under the element and a current thus flows in a vertical direction. When voltage not less than the threshold is applied to the gate electrode 73, channels are formed in the epitaxial layer 72 in regions on both sides of the gate electrode 73, allowing a current to flow from the source electrode 76 to the drain electrode 77.

The highly thermal conductive substrate 71 is formed of a material having a higher thermal conductivity than $Ga_2O_3$-based crystal, such as MN or Si, and contains an n-type dopant. The n-type dopant concentration of the highly thermal conductive substrate 71 is higher than that of the epitaxial layer 72.

In the vertical transistor 70, a base substrate used as a base for epitaxial growth of the epitaxial layer 72, e.g., a base substrate 78 described later, is removed and the highly thermal conductive substrate 71 is used as a layer to be in ohmic contact with the drain electrode 77. Since the thermal conductivity of the highly thermal conductive substrate 71 is higher than that of the base substrate 78 formed of a $Ga_2O_3$-based crystal, heat dissipation can be improved by using the highly thermal conductive substrate 71 as a layer to be in ohmic contact with the drain electrode 77. The vertical transistor 70 thus has excellent heat dissipation property.

In addition, since the highly thermal conductive substrate 71 has a high thermal conductivity, thickness reduction of the vertical transistor 70 to improve heat dissipation is not necessary.

The gate electrode 73, the gate insulating film 74, the contact region 75, the source electrode 76, the drain electrode 77 and the p+ region 79 are respectively same as the gate electrode 23, the gate insulating film 24, the contact region 25, the source electrode 26, the drain electrode 27 and the p+ region 28 in the second embodiment. The epitaxial layer 72 is also composed of layers 72a and 72b which are the same as the layers 22a and 22b of the epitaxial layer 22 in the second embodiment.

A method for manufacturing the vertical transistor 70 in the seventh embodiment will be described below, along with a specific example of a method of removing the base substrate 78. However, the method for manufacturing the vertical transistor 70 is not limited to the example described below.

(Semiconductor Element Manufacturing Method)

FIGS. 28A to 28D are vertical cross-sectional views showing an exemplary process of manufacturing the vertical transistor 70 in the seventh embodiment.

Figure 28A:
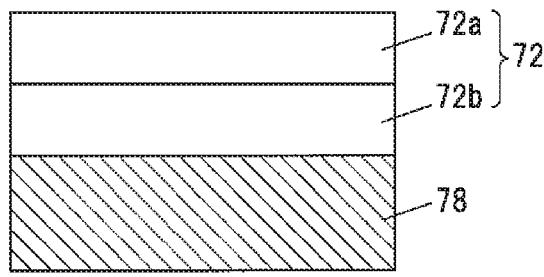
FIG. 28A is a vertical cross-sectional view showing an exemplary process of manufacturing the vertical transistor in the seventh embodiment.

Firstly, as shown in FIG. 28A, the epitaxial layer 72 is formed on the base substrate 78.

The base substrate 78 is the same substrate as the base substrate 11 in the first embodiment and has a thickness of, e.g., 600 µm before polishing. The base substrate 78 may not contain an n-type dopant. The process of forming the epitaxial layer 72 is the same as the process of forming the epitaxial layer 22 in the second embodiment.

Figure 28B:
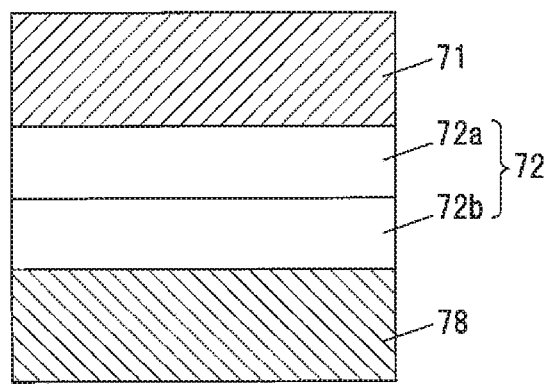
FIG. 28B is a vertical cross-sectional view showing the exemplary process of manufacturing the vertical transistor in the seventh embodiment.

Next, as shown in FIG. 28B, the highly thermal conductive substrate 71 is bonded to the upper surface of the epitaxial layer 72. For example, direct bonding such as surface activated bonding is used to bond the highly thermal conductive substrate 71 to the epitaxial layer 72. The epitaxial layer 72 and the highly thermal conductive substrate 71, which are bonded by surface activated bonding, are in ohmic contact with each other at a bonding interface therebetween.

Figure 28C:
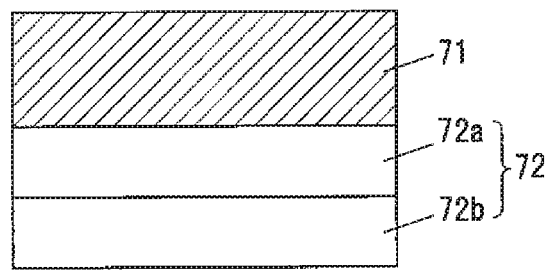
FIG. 28C is a vertical cross-sectional view showing the exemplary process of manufacturing the vertical transistor in the seventh embodiment.

Next, as shown in FIG. 28C, the base substrate 78 supported by the highly thermal conductive substrate 71 is reduced in thickness by polishing, and is eventually removed by further continuous polishing.

The polishing may be combined with another process such as etching, or a method other than polishing may be used.

Figure 28D:
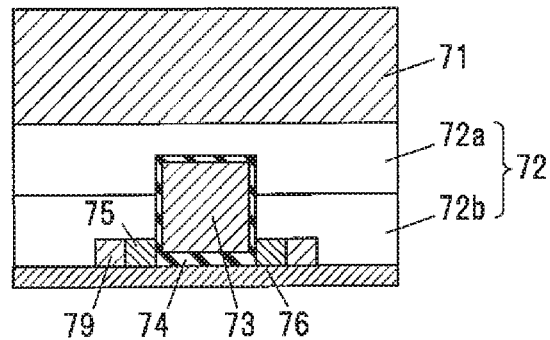
FIG. 28D is a vertical cross-sectional view showing the exemplary process of manufacturing the vertical transistor in the seventh embodiment.

Next, as shown in FIG. 28D, the gate electrode 73, the gate insulating film 74, the contact regions 75 and the p+ regions 79 are formed in the epitaxial layer 72, and the source electrode 76 is then formed on the epitaxial layer 72. Additionally, an electrode termination structure or a passivation film may be provided on the epitaxial layer 72.

The processes of forming the gate electrode 73, the gate insulating film 74, the contact regions 75, the p+ regions 79 and the source electrode 76 are respectively same as the processes of forming the gate electrode 23, the gate insulating film 24, the contact regions 25, the p+ regions 28 and the source electrode 26 in the second embodiment.

Figure 29:
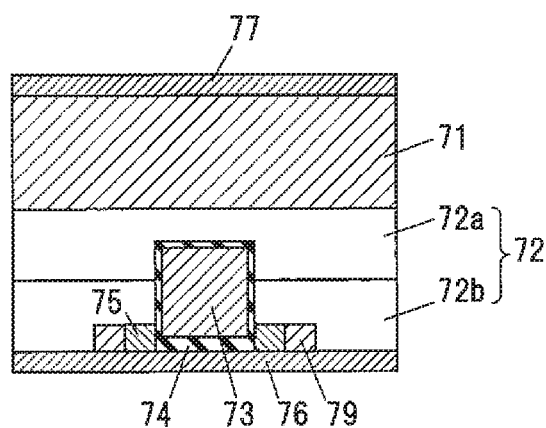
FIG. 29 is a vertical cross-sectional view showing the exemplary process of manufacturing the vertical transistor in the seventh embodiment.

Next, as shown in FIG. 29, the drain electrode 77 is formed on a surface of the highly thermal conductive substrate 71 on the opposite side to the epitaxial layer 72.

The process of forming the drain electrode 77 is the same as the process of forming the drain electrode 27 in the second embodiment.

Eighth Embodiment

The eighth embodiment is a vertical semiconductor element, implemented as a vertical transistor having a MISFET structure.

(Structure of Semiconductor Element)

Figure 30:
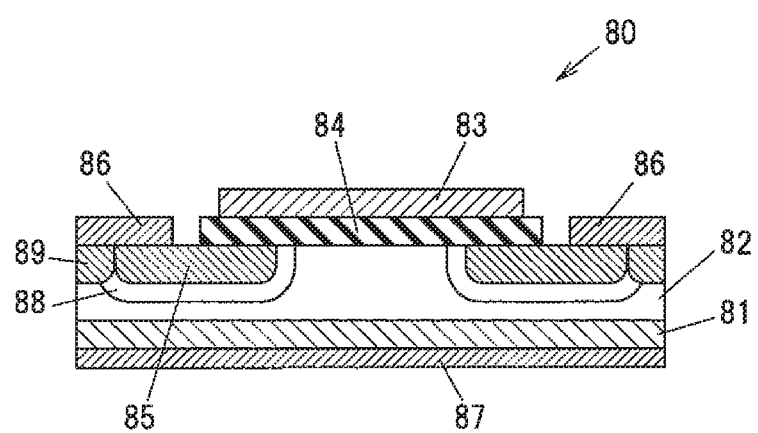
FIG. 30 is a vertical cross-sectional view showing a vertical transistor in an eighth embodiment.

FIG. 30 is a vertical cross-sectional view showing a vertical transistor 80 in the eighth embodiment. The vertical transistor 80 is provided with an epitaxial layer 82 formed on a base substrate 81, two source electrodes 86 formed on the epitaxial layer 82, a gate electrode 83 formed on the epitaxial layer 82 via a gate insulating film 84 in a region between the two source electrodes 86, n-type contact regions 85 formed in the epitaxial layer 82 respectively under the two source electrodes 86, p-type body regions 88 respectively surrounding the two contact regions 85, p+ regions 89 formed on the outer sides of the two contact regions 85, and a drain electrode 87 formed on a surface of the base substrate 81 on the opposite side to the epitaxial layer 82.

In the vertical transistor 80, when voltage not less than the threshold is applied to the gate electrode 83, channels are formed in regions of the p-type body regions 88 under the gate electrode 83, allowing a current to flow from the source electrode 86 to the drain electrode 87.

The base substrate 81 and the epitaxial layer 82 are formed of a $Ga_2O_3$-based crystal and contain an n-type dopant. The n-type dopant is preferably a Group IV element such as Si or Sn.

The thickness of the base substrate 81 is the same as the thickness of the base substrate 11 in the first embodiment. Since the base substrate 81 is thin, heat generated in the vertical transistor 80 can be efficiently released through the base substrate 81. The vertical transistor 80 thus has excellent heat dissipation property.

Alternatively, after completely removing the base substrate 81, an ion implanted layer to be ohmic contact with the drain electrode 27 may be formed by implanting Group IV impurity ions into the lower surface of the epitaxial layer 82, in the same manner as the Schottky diode 40 in the fourth embodiment.

The epitaxial layer 82 is formed of a $Ga_2O_3$-based crystal having a high breakdown field strength, and thus can have a smaller thickness than elements formed using other semiconductor materials while suppressing a decrease in withstand voltage property of the vertical transistor 80, resulting in that the thickness of the entire vertical transistor 80 can be reduced and also heat dissipation can be further improved. As such, the vertical transistor 80 has both high heat dissipation property and high withstand voltage property.

The plane orientation of the principal surface of the base substrate 81 is also the same as that of the base substrate 11 in the first embodiment, and (010) is especially preferable.

The thickness of the epitaxial layer 82 is, e.g., 0.4 to 30 µm.

The gate electrode 83, the gate insulating film 84, the source electrode 86 and the drain electrode 87 are formed of, e.g., the same materials as the gate electrode 23, the gate insulating film 24, the source electrode 26 and the drain electrode 27 in the second embodiment.

The contact regions 85 are high n-type dopant concentration regions formed in the epitaxial layer 82 and are connected to the source electrodes 86. The n-type dopant is preferably a Group IV element such as Si or Sn.

The body region 88 and the p+ region 89 contain a p-type dopant. The p-type dopant concentration of the p+ region 89 is higher than that of the body region 88. The p-type dopant is preferably Fe or a Group II element such as Be, Mg or Zn. Alternatively, the body region 88 may be an i-type region formed by carrier compensation.

The vertical transistor 80 can be manufactured using the method of manufacturing the vertical transistor 20 in the second embodiment.

In detail, in the process of forming the gate electrode 23, the gate insulating film 24 and the contact region 25 of the vertical transistor 20, the body regions 88 and the contact region 85 are formed instead. Then, in the process of forming the source electrode 26, the gate insulating film 84, the gate electrode 83 and the source electrode 86 are formed instead.

The body region 88, the p+ region 89 and the contact region 85 are formed by, e.g., implanting a dopant into the epitaxial layer 82 using the ion implantation method.

The methods of forming the base substrate 81, the epitaxial layer 82 and the drain electrode 87 are respectively same as the methods of forming the base substrate 21, the epitaxial layer 22 and the drain electrode 27 of the vertical transistor 20.

Ninth Embodiment

The ninth embodiment is a vertical semiconductor element, implemented as a Schottky diode.

(Structure of Semiconductor Element)

Figure 31:
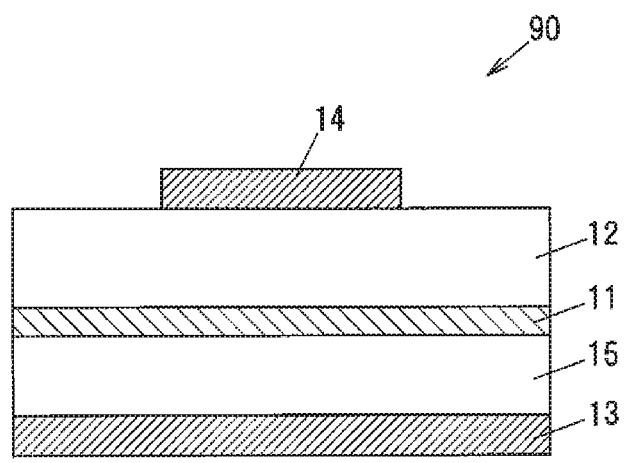
FIG. 31 is a vertical cross-sectional view showing a Schottky diode in a ninth embodiment.

FIG. 31 is a vertical cross-sectional view showing a Schottky diode 90 in the ninth embodiment. The Schottky diode 90 is provided with the supporting substrate 15, the base substrate 11 attached to the supporting substrate, the epitaxial layer 12 formed on an upper surface of the base substrate 11 (a surface opposite to the surface in contact with the supporting substrate 15) by epitaxial growth, the cathode electrode 13 formed on a lower surface of the supporting substrate 15 (a surface opposite to the surface in contact with the base substrate 11) and in ohmic contact with the supporting substrate 15, and the anode electrode 14 formed on an upper surface of the epitaxial layer 12 (a surface opposite to the surface in contact with the base substrate 11) and in Schottky contact with the epitaxial layer 12.

In the Schottky diode 90, a Schottky barrier height at an interface between the anode electrode 14 and the epitaxial layer 12 is lowered by applying forward bias between the anode electrode 14 and the cathode electrode 13 and current flows from the anode electrode 14 to the cathode electrode 13. On the other hand, when reverse bias is applied between the anode electrode 14 and the cathode electrode 13, the Schottky barrier height at the interface between the anode electrode 14 and the epitaxial layer 12 is increased and the current does not flow.

The base substrate 11 is the same as that used in the first embodiment. However, since the base substrate 11 in the ninth embodiment is not in ohmic contact with the cathode electrode, the n-type dopant concentration of the base substrate 11 may be, e.g., at a similar level to the epitaxial layer 12.

The supporting substrate 15 is the same as that used in the first embodiment. However, the supporting substrate 15 in the ninth embodiment is in ohmic contact with the cathode electrode and is thus formed of a conductor or a semiconductor containing a high concentration of n-type dopant.

Since the base substrate 11 is thin, heat generated in the Schottky diode 90 can be efficiently released through the base substrate 11 via the supporting substrate 15. The Schottky diode 90 thus has excellent heat dissipation property.

The epitaxial layer 12, the cathode electrode 13 and the anode electrode 14 are the same as those used in the first embodiment.

The epitaxial layer 12 is formed of a $Ga_2O_3$-based crystal having a high breakdown field strength, and thus can have a smaller thickness than elements formed using other semiconductor materials while suppressing a decrease in withstand voltage property of the Schottky diode 90, resulting in that the thickness of the entire Schottky diode 90 can be reduced and also heat dissipation can be further improved. As such, the Schottky diode 90 has both high heat dissipation property and high withstand voltage property.

A method for manufacturing the Schottky diode 10 in the present embodiment will be described below, along with specific example.

(Semiconductor Element Manufacturing Method)

FIGS. 32A to 32E are vertical cross-sectional views showing an exemplary process of manufacturing the Schottky diode 90 in the ninth embodiment. In the example shown in FIGS. 32A to 32E, the thickness of the base substrate 11 is reduced by polishing and an epitaxial layer is subsequently grown on the polished surface of the base substrate 11.

Figure 32A:
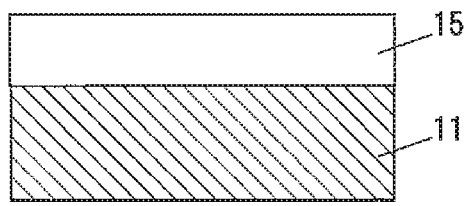
FIG. 32A is a vertical cross-sectional view showing an exemplary process of manufacturing the Schottky diode in the ninth embodiment.

Firstly, as shown in FIG. 32A, the base substrate 11 is attached to the supporting substrate 15. The method of attaching the base substrate 11 to the supporting substrate 15 is, e.g., direct bonding such as surface activated bonding, or adhesion using a conductive adhesive.

Figure 32B:
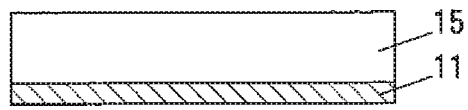
FIG. 32B is a vertical cross-sectional view showing the exemplary process of manufacturing the Schottky diode in the ninth embodiment.

Next, as shown in FIG. 32B, the thickness of the base substrate 11 supported by the supporting substrate 15 is reduced to not less than 10 μm and not more than 50 μm by polishing.

The polishing performed on this base substrate 11 is the same as the polishing performed on the base substrate 11 in the first embodiment.

The method of removing the base substrate 11 is not limited to polishing. The polishing may be combined with another process such as etching. The thickness of the base substrate 11 can be reduced to less than 10 μm by etching.

The base substrate 11 may be separated from the supporting substrate 15 after reducing the thickness. The separated base substrate 11 is a semiconductor substrate formed of a $Ga_2O_3$-based crystal and having a thickness of not less than 0.05 μm and not more than 50 μm, and can be used as a based substrate for epitaxial growth to manufacture another semiconductor element. In addition, to increase the thermal conductivity of the base substrate 11 in the thickness direction, the plane orientation of the principal surface of the base substrate 11 is preferably (010) in the same manner as the first embodiment.

Figure 32C:
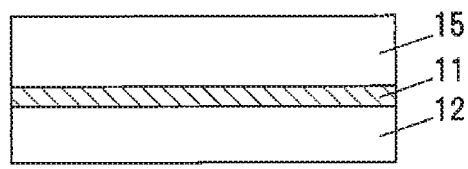
FIG. 32C is a vertical cross-sectional view showing the exemplary process of manufacturing the Schottky diode in the ninth embodiment.

Next, as shown in FIG. 32C, the epitaxial layer 12 is formed on the base substrate 11.

The process of forming this epitaxial layer 12 is the same as the process of forming the epitaxial layer 12 in the first embodiment.

Figure 32D:
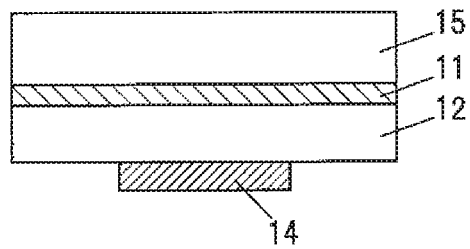
FIG. 32D is a vertical cross-sectional view showing the exemplary process of manufacturing the Schottky diode in the ninth embodiment.

Next, as shown in FIG. 32D, the anode electrode 14 is formed on a surface of the epitaxial layer 12 on the opposite side to the base substrate 11. The process of forming this anode electrode 14 is the same as the process of forming the anode electrode 14 in the first embodiment.

Figure 32E:
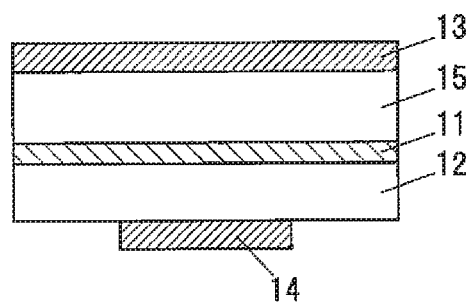
FIG. 32E is a vertical cross-sectional view showing the exemplary process of manufacturing the Schottky diode in the ninth embodiment.

Next, as shown in FIG. 32E, the cathode electrode 13 is formed on a surface of the supporting substrate 15 on the opposite side to the base substrate 11. The process of forming this cathode electrode 13 is the same as the process of forming the cathode electrode 13 in the first embodiment.

The method of manufacturing the semiconductor element in the ninth embodiment is applicable to manufacturer a semiconductor element having a thinned based substrate formed of a $Ga_2O_3$-based crystal, such as vertical transistor or lateral transistor.

Tenth Embodiment

The tenth embodiment is a vertical semiconductor element, implemented as a vertical transistor having a MISFET structure.

(Structure of Semiconductor Element)

Figure 33:
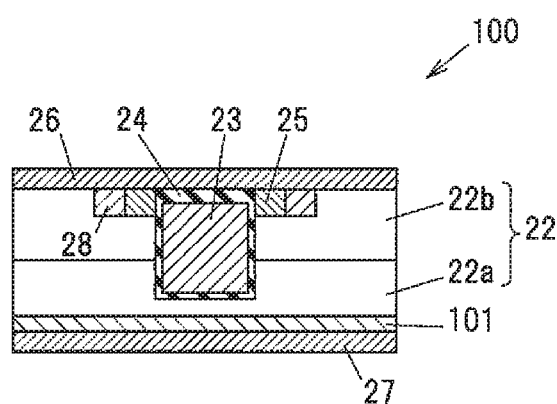
FIG. 33 is a vertical cross-sectional view showing a vertical transistor in a tenth embodiment.

FIG. 33 is a vertical cross-sectional view showing a vertical transistor 100 in the tenth embodiment. The vertical transistor 100 is provided with an ion implanted layer 101 formed on one surface of the epitaxial layer 22, the gate electrode 23 covered with the gate insulating film 24 and embedded in the epitaxial layer 22, the contact regions 25 formed in the epitaxial layer 22 so as to be located on both sides of the gate electrode 23, the $p^+$ regions 28 formed on respective sides of the contact regions 25, the source electrode 26 formed on the epitaxial layer 22 and connected to the contact regions 25, and the drain electrode 27 formed on the lower surface of the epitaxial layer 22 (a surface on which the ion implanted layer 101 is provided) and in ohmic contact with the ion implanted layer 101.

The vertical transistor 100 is a vertical semiconductor element in which the source electrode 26 and the drain electrode 27 are arranged respectively on and under the element and a current thus flows in a vertical direction. When voltage not less than the threshold is applied to the gate electrode 23, channels are formed in the epitaxial layer 22 in regions on both sides of the gate electrode 23, allowing a current to flow from the source electrode 26 to the drain electrode 27.

The epitaxial layer 22, the gate electrode 23, the gate insulating film 24, the contact region 25, the source electrode 26, the drain electrode 27 and the $p^+$ region 28 are the same as those used in the second embodiment.

The ion implanted layer 101 is a layer formed by implanting a high dose of n-type dopant into the layer 22a of the epitaxial layer 22, and has a higher n-type dopant concentration than the layer 22a. The n-type dopant is preferably a Group IV element such as Si or Sn. To reduce the conduction loss of Schottky diode, it is particularly preferable to use Si as an n-type dopant since an activation rate of Si when implanted at a high dose is higher than Sn.

In the vertical transistor 100, a base substrate used as a base for epitaxial growth of the epitaxial layer 22, e.g., the base substrate 21 described later, is removed and the ion implanted layer 101 is used as a layer to be in ohmic contact with the drain electrode 27. Therefore, a heat dissipation path to the ion implanted layer 101 does not pass through the base substrate and heat is efficiently dissipated. The vertical transistor 100 thus has excellent heat dissipation property. Furthermore, use of the ion implantation technique can achieve a higher donor concentration than when using a method in which an impurity is added during growth of the substrate, resulting in reduction in the conduction loss of Schottky diode.

Since the epitaxial layer 22 is formed of a $Ga_2O_3$-based crystal having high breakdown field strength, a decrease in withstand voltage property of the vertical transistor 100 can be suppressed even though the base substrate 21 is removed.

Thus, the vertical transistor 100 has both high heat dissipation property and high withstand voltage property.

A method for manufacturing the vertical transistor 100 in the tenth embodiment will be described below, along with specific example. However, the method for manufacturing the vertical transistor 100 is not limited to the example described below.

(Semiconductor Element Manufacturing Method)

FIGS. 34A to 34D and 35A to 35D are vertical cross-sectional views showing an exemplary process of manufacturing the vertical transistor 100 in the tenth embodiment.

Figure 34A:
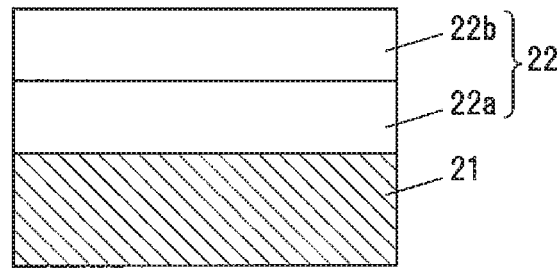
FIG. 34A is a vertical cross-sectional view showing an exemplary process of manufacturing the vertical transistor in the tenth embodiment.

Firstly, as shown in FIG. 34A, the epitaxial layer 22 is formed on the base substrate 21.

The base substrate 21 is the same substrate as the base substrate 11 in the first embodiment and has a thickness of, e.g., 600 µm before polishing. The base substrate 21 may not contain an n-type dopant. The process of forming this epitaxial layer 22 is the same as the process of forming the epitaxial layer 22 in the second embodiment.

Figure 34B:
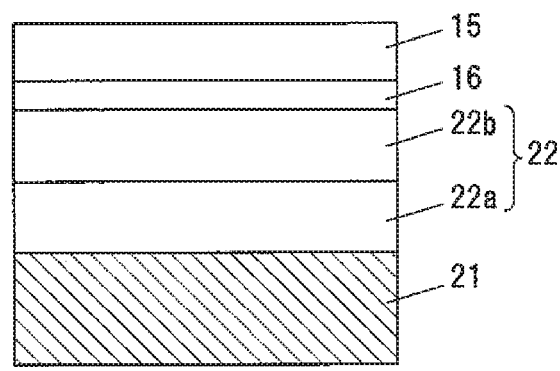
FIG. 34B is a vertical cross-sectional view showing the exemplary process of manufacturing the vertical transistor in the tenth embodiment.

Next, as shown in FIG. 34B, the layer 22a of the epitaxial layer 22 is attached to the supporting substrate 15 via the adhesive layer 16. The material of the supporting substrate 15 used here is, e.g., metal, resin or ceramic, etc., but it is not limited thereto. The adhesive layer 16 is the same as that used in the first embodiment.

Figure 34C:
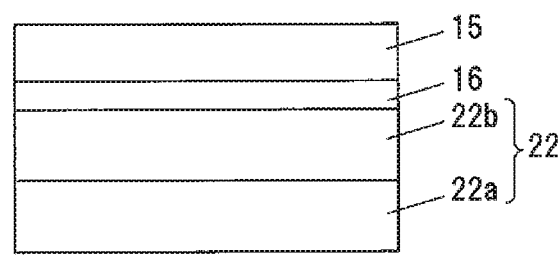
FIG. 34C is a vertical cross-sectional view showing the exemplary process of manufacturing the vertical transistor in the tenth embodiment.

Next, as shown in FIG. 34C, the base substrate 21 supported by the supporting substrate 15 is reduced in thickness by polishing, and is eventually removed by further continuous polishing.

The polishing may be combined with another process such as etching, or a method other than polishing may be used.

Figure 34D:
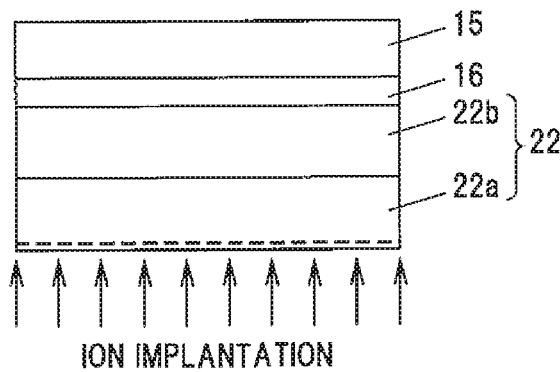
FIG. 34D is a vertical cross-sectional view showing the exemplary process of manufacturing the vertical transistor in the tenth embodiment.

Next, as shown in FIG. 34D, ions of an n-type dopant are implanted into the lower surface of the layer 22a of the epitaxial layer 22.

Figure 35A:
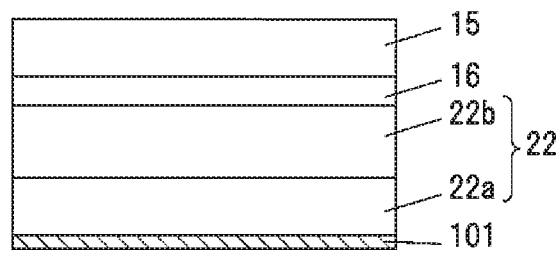
FIG. 35A is a vertical cross-sectional view showing the exemplary process of manufacturing the vertical transistor in the tenth embodiment.

Next, as shown in FIG. 35A, the n-type dopant implanted in the layer 22a is activated by annealing and the ion implanted layer 101 is thereby formed. The annealing is performed, e.g., in an inert atmosphere at 800 to 1000° C. for 30 minutes.

Figure 35B:
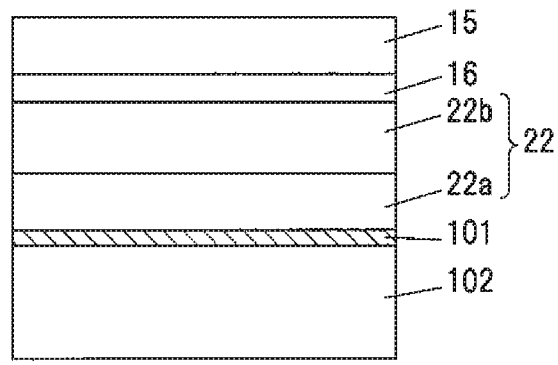
FIG. 35B is a vertical cross-sectional view showing the exemplary process of manufacturing the vertical transistor in the tenth embodiment.

Next, as shown in FIG. 35B, a supporting substrate 102 is attached to the lower surface of the layer 22a (a surface on which the ion implanted layer 101 is formed). The material of the supporting substrate 102 used here is, e.g., metal, resin or ceramic, etc., but it is not limited thereto.

The layer 22a is attached to the supporting substrate 102 using solder (e.g., Au—Sn, Sn—Ag—Cu or Si—Ge), Ag paste, resin or inorganic material, etc.

Figure 35C:
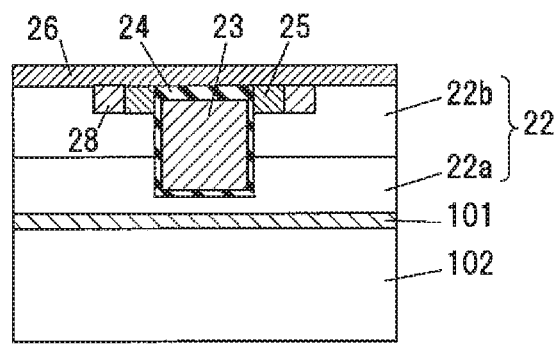
FIG. 35C is a vertical cross-sectional view showing the exemplary process of manufacturing the vertical transistor in the tenth embodiment.

Next, as shown in FIG. 35C, the epitaxial layer 22 supported by the supporting substrate 102 is separated from the supporting substrate 15 and the adhesive layer 16. Then, the gate electrode 23, the gate insulating film 24, the contact regions 25 and the $p^+$ regions 28 are formed in the epitaxial layer 22. After that, the source electrode 26 is formed on the epitaxial layer 22. Additionally, an electrode termination structure or a passivation film may be provided on the epitaxial layer 22.

The processes of forming the gate electrode 23, the gate insulating film 24, the contact regions 25, the $p^+$ regions 28 and the source electrode 26 are respectively same as the processes of forming the gate electrode 23, the gate insulating film 24, the contact regions 25, the $p^+$ regions 28 and the source electrode 26 in the second embodiment.

Figure 35D:
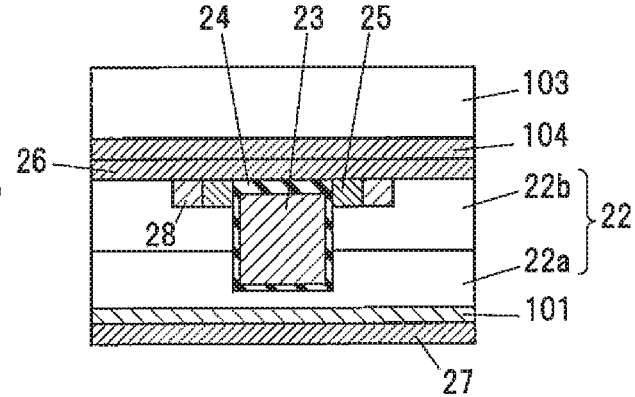
FIG. 35D is a vertical cross-sectional view showing the exemplary process of manufacturing the vertical transistor in the tenth embodiment.

Next, as shown in FIG. 35D, a supporting substrate 103 having an electrode 104 on one side is prepared, and the epitaxial layer 22 is attached to the supporting substrate 103 by bonding the source electrode 26 to the electrode 104.

Then, the epitaxial layer 22 supported by the supporting substrate 103 is separated from the supporting substrate 102 and the drain electrode 27 is formed on the lower surface of the layer 22a. The material of the supporting substrate 103 is not specifically limited. However, the supporting substrate 103, when kept as a supporting substrate of the vertical transistor 100 as described later, is preferably formed of a material having a higher thermal conductivity than $\beta$-$Ga_2O_3$, e.g., a metal such as Al, a nitride such as AlN, SiN or GaN, an oxide such as $SiO_2$ or $Al_2O_3$, or, SiC, Si, GaAs or diamond, etc.

The process of forming this drain electrode 27 is the same as the process of forming the drain electrode 27 in the first embodiment.

The supporting substrate 103 may be kept as a supporting substrate of the finished vertical transistor 100. In this case, external power may be supplied to the source electrode 26 through the electrode 104 of the supporting substrate 103. In case that the supporting substrate 103 is electrically conductive, external power may be supplied to the source electrode 26 through the supporting substrate 103 and the electrode 104. Alternatively, the vertical transistor 100 may be separated from the supporting substrate 103 and then attached to another supporting substrate.

Effects of the Embodiments

In the first to tenth embodiments, it is possible to effectively dissipate heat by reducing the thickness of the base substrate, or by removing the base substrate and then forming the ion implanted layer, or by removing the base substrate and attaching the highly thermal conductive substrate. As a result, heat dissipation property of the semiconductor element is improved.

Although the embodiments of the invention have been described above, the invention is not to be limited to the above-mentioned embodiments, and the various kinds of modifications can be implemented without departing from the gist of the invention.

For example, the semiconductor element is not limited to those disclosed in the embodiments, and the invention is applicable to any semiconductor element as long as it has a structure in which an epitaxial layer formed of a $Ga_2O_3$-based crystal is epitaxially grown on a base substrate formed of a $Ga_2O_3$-based crystal, or a structure having an ion implanted layer with a high dopant concentration formed in the epitaxial layer after removing the base substrate.

In addition, constituent elements of the above-mentioned embodiments can be arbitrarily combined without departing from the gist of the invention.

In addition, the invention according to claims is not to be limited to the above-mentioned embodiments. Further, please note that all combinations of the features described in the embodiments are not necessary to solve the problem of the invention.

INDUSTRIAL APPLICABILITY

Provided are a $Ga_2O_3$-based semiconductor element having excellent heat dissipation property and withstand voltage property, as well as a method for manufacturing the semiconductor element, and a semiconductor substrate and a crystal laminate structure that are available for manufacturing the semiconductor element.

REFERENCE SIGNS LIST 10, 40, 60, 90: SCHOTTKY DIODE
11, 21, 31, 81: BASE SUBSTRATE
12, 22, 32, 42, 62, 72, 82: EPITAXIAL LAYER
20, 70, 80, 100: VERTICAL TRANSISTOR
30: LATERAL TRANSISTOR
41, 101: ION IMPLANTED LAYER
15, 46, 51, 52: SUPPORTING SUBSTRATE
61, 71: HIGHLY THERMAL CONDUCTIVE SUBSTRATE

The invention claimed is:

1. A semiconductor element, comprising:
an epitaxial layer that comprises a $Ga_2O_3$-based crystal including an n-type dopant;
an ion implanted layer that is formed on a surface of the epitaxial layer and includes a higher concentration of n-type dopant than the epitaxial layer;
an anode electrode connected to the epitaxial layer;
a cathode electrode connected to the ion implanted layer; and
at least one supporting substrate that includes a material having a higher thermal conductivity than the $Ga_2O_3$-based crystal and is attached to an upper surface of the epitaxial layer or a lower surface of the ion implanted layer via the anode electrode or the cathode electrode.

2. The semiconductor element according to claim 1, wherein the epitaxial layer and the ion implanted layer are each attached to the at least one supporting substrate via the anode electrode or the cathode electrode.

3. A semiconductor element; comprising: a base substrate that comprises a $Ga_2O_3$-based crystal having a thickness of not less than 0.05 µm and not more than 50 µm; an epitaxial layer that comprises a $Ga_2O_3$-based crystal and is epitaxially grown on the base substrate; and at least one supporting substrate that includes a material having a higher thermal conductivity than the $\beta$-$Ga_2O_3$, wherein the supporting substrate is attached to a lower surface of the base substrate or an upper surface of the epitaxial layer via one or more electrodes.

4. A semiconductor substrate comprising:
a $Ga_2O_3$-based crystal, wherein the semiconductor substrate has a thickness of not less than 0.05 µm and not more than 50 µm; an epitaxial layer that comprises a $Ga_2O_3$-based crystal and is epitaxially grown on the semiconductor substrate; and wherein the semiconductor substrate is attached, via one or more electrodes, to a supporting substrate that includes a material having a higher thermal conductivity than $\beta$-$Ga_2O_3$.

5. A crystal laminate structure, comprising: a base substrate that comprises a $Ga_2O_3$-based crystal having a thickness of not less than 0.5 µm and not more than 50 µm; an epitaxial layer that comprises a $Ga_2O_3$-based crystal and is epitaxially grown on the base substrate; and at least one supporting substrate that includes a material having a higher thermal conductivity than the $\beta$-$Ga_2O_3$, wherein the supporting substrate is attached to a lower surface of the base substrate or an upper surface of the epitaxial layer via one or more electrodes.

6. A semiconductor element, comprising: a base substrate that comprises a $Ga_2O_3$-based crystal having a thickness of not less than 0.05 µm and not more than 50 µm; an epitaxial layer that comprises a $Ga_2O_3$-based crystal and is epitaxially grown on the base substrate; and at least one supporting substrate that includes a material having a higher thermal conductivity than $\beta$-$Ga_2O_3$ wherein the base substrate and the epitaxial layer are each attached to supporting substrates of the at least one supporting substrate, wherein the base substrate and the epitaxial layer are each attached to the supporting substrates via one or more electrodes, and wherein the at least one supporting substrate is attached to a lower surface of the base substrate or an upper surface of the epitaxial layer.

7. A semiconductor element, comprising: a base substrate that comprises a $Ga_2O_3$-based crystal having a thickness of not less than 0.05 μm and not more than 50 μm; an epitaxial layer that comprises a $Ga_2O_3$-based crystal and is epitaxially grown on the base substrate; and at least one supporting substrate that includes a material having a higher thermal conductivity than the $\beta$-$Ga_2O_3$, wherein a thickness of the base substrate is less than 10 μm, wherein the base substrate and the epitaxial layer are each attached to supporting substrates of the at least one supporting substrate, wherein the base substrate and the epitaxial layer are each attached to the supporting substrates via one or more electrodes, and wherein the at least one supporting substrate is attached to a lower surface of the base substrate or an upper surface of the epitaxial layer.

* * * * *